(12) United States Patent
Marinov

(10) Patent No.: US 12,094,811 B2
(45) Date of Patent: Sep. 17, 2024

(54) CONNECTING ELECTRONIC COMPONENTS TO SUBSTRATES

(71) Applicant: Kulicke and Soffa Industries, Inc., Fort Washington, PA (US)

(72) Inventor: Val Marinov, Fargo, MA (US)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 531 days.

(21) Appl. No.: 16/096,618

(22) PCT Filed: Apr. 21, 2017

(86) PCT No.: PCT/US2017/028964
§ 371 (c)(1),
(2) Date: Oct. 25, 2018

(87) PCT Pub. No.: WO2017/189367
PCT Pub. Date: Nov. 2, 2017

(65) Prior Publication Data
US 2020/0328143 A1 Oct. 15, 2020

Related U.S. Application Data

(60) Provisional application No. 62/329,301, filed on Apr. 29, 2016.

(51) Int. Cl.
*H01L 23/498* (2006.01)
*H01L 21/48* (2006.01)
(Continued)

(52) U.S. Cl.
CPC .... *H01L 23/49838* (2013.01); *H01L 21/4814* (2013.01); *H01L 23/49816* (2013.01);
(Continued)

(58) Field of Classification Search
CPC ......... H01L 23/49838; H01L 23/49816; H01L 23/49827; H01L 23/52; H01L 21/4814; H01L 24/83; H01L 24/16; H01L 24/97
See application file for complete search history.

(56) References Cited

U.S. PATENT DOCUMENTS 5,222,014 A * 6/1993 Lin ................. H01L 25/105
257/E23.125
5,784,261 A * 7/1998 Pedder ............. H01L 21/563
29/841

(Continued)

FOREIGN PATENT DOCUMENTS

CN 1665023 9/2005
CN 1842906 10/2006
(Continued)

OTHER PUBLICATIONS

Taiwanese Office Action in TW Appln. No. 106114357, dated Mar. 12, 2021, 44 pages with English translation.
(Continued)

*Primary Examiner* — Evren Seven
(74) *Attorney, Agent, or Firm* — Christopher M. Spletzer, Sr.

(57) ABSTRACT

An apparatus includes a first substrate including one or more electrical connection features; and an assembly including: a second substrate; conductive features formed on the second substrate, one or more of which are electrically connected to corresponding electrical connection features of the first substrate; and an electronic component between the second substrate and the first substrate and electrically connected to one or more of the conductive features.

34 Claims, 20 Drawing Sheets

(51) Int. Cl.
*H01L 23/00* (2006.01)
*H01L 23/52* (2006.01)
*H05K 1/02* (2006.01)
*H05K 1/03* (2006.01)
*H05K 1/18* (2006.01)
*H05K 3/36* (2006.01)

(52) U.S. Cl.
CPC ........ *H01L 23/49827* (2013.01); *H01L 23/52* (2013.01); *H01L 24/16* (2013.01); *H01L 24/83* (2013.01); *H01L 24/97* (2013.01); *H05K 1/028* (2013.01); *H05K 1/0393* (2013.01); *H05K 1/189* (2013.01); *H05K 3/361* (2013.01); *H01L 2224/16225* (2013.01); *H01L 2224/83851* (2013.01); *H01L 2924/14* (2013.01); *H01L 2924/15173* (2013.01); *H01L 2924/15311* (2013.01); *H01L 2924/15321* (2013.01); *H01L 2924/181* (2013.01)

(56) References Cited

U.S. PATENT DOCUMENTS

| | | | | |
|---|---|---|---|---|
| 5,939,783 | A * | 8/1999 | Laine | H01L 23/36 257/772 |
| 6,121,682 | A * | 9/2000 | Kim | H01L 25/50 257/E21.705 |
| 6,166,443 | A * | 12/2000 | Inaba | H01L 23/3107 257/781 |
| 6,175,158 | B1 * | 1/2001 | Degani | H01L 23/49833 257/E23.07 |
| 6,388,333 | B1 | 5/2002 | Taniguchi et al. | |
| 6,396,136 | B2 * | 5/2002 | Kalidas | H01L 23/50 257/E23.079 |
| 6,437,990 | B1 * | 8/2002 | Degani | H01L 25/0655 361/767 |
| 7,495,319 | B2 | 2/2009 | Fukuda et al. | |
| 7,709,935 | B2 | 5/2010 | Islam et al. | |
| 7,892,988 | B2 | 2/2011 | Pause | |
| 9,099,444 | B2 | 8/2015 | Mallik et al. | |
| 9,196,586 | B2 | 11/2015 | Chen et al. | |
| 2003/0003779 | A1 * | 1/2003 | Rathburn | H01L 24/73 257/E23.068 |
| 2004/0198033 | A1 | 10/2004 | Lee et al. | |
| 2004/0246065 | A1 | 12/2004 | Roberson et al. | |
| 2007/0243661 | A1 | 10/2007 | Jackson et al. | |
| 2009/0267171 | A1 | 10/2009 | Yean et al. | |
| 2011/0186992 | A1 * | 8/2011 | Wu | H01L 23/147 257/737 |
| 2011/0285023 | A1 | 11/2011 | Wen-Wei et al. | |
| 2014/0367850 | A1 | 12/2014 | Wang | |
| 2015/0140736 | A1 * | 5/2015 | Pendse | H01L 24/00 438/109 |
| 2015/0235989 | A1 | 8/2015 | Yu et al. | |
| 2015/0259194 | A1 * | 9/2015 | Lin | H01L 24/19 257/773 |
| 2016/0079171 | A1 * | 3/2016 | Yeh | H01L 25/0657 257/532 |
| 2019/0057891 | A1 | 2/2019 | Marinov et al. | |

FOREIGN PATENT DOCUMENTS

| | | |
|---|---|---|
| CN | 102144291 | 8/2011 |
| CN | 102160170 | 8/2011 |
| CN | 102714190 | 10/2013 |
| CN | 103988300 | 8/2014 |
| CN | 104241196 | 12/2014 |
| CN | 104851841 | 8/2015 |
| CN | 105374784 | 3/2016 |
| TW | 201810443 | 3/2018 |
| WO | WO 2012/142177 | 10/2012 |
| WO | WO 2016/022528 | 2/2016 |
| WO | WO 2017/189367 | 11/2017 |

OTHER PUBLICATIONS

International Preliminary Report on Patentability in International Application No. PCT/US2017/028964, dated Oct. 30, 2018, 13 pages.

Invitation to Pay Additional Fees and, Where Applicable, Protest Fee in International Application No. PCT/US2017/28964, dated Jul. 10, 2017, 3 pages.

International Search Report and Written Opinion from PCT application PCT/US2017/028964 mailed on Sep. 8, 2017 (22 pages).

Chinese Office Action in CN Appln. No. 201780040912.3, dated Dec. 23, 2021, 20 pages with English Translation.

Taiwanese Office Action in TW Appln. No. 106114357, dated Oct. 26, 2021, 44 pages with English translation.

\* cited by examiner

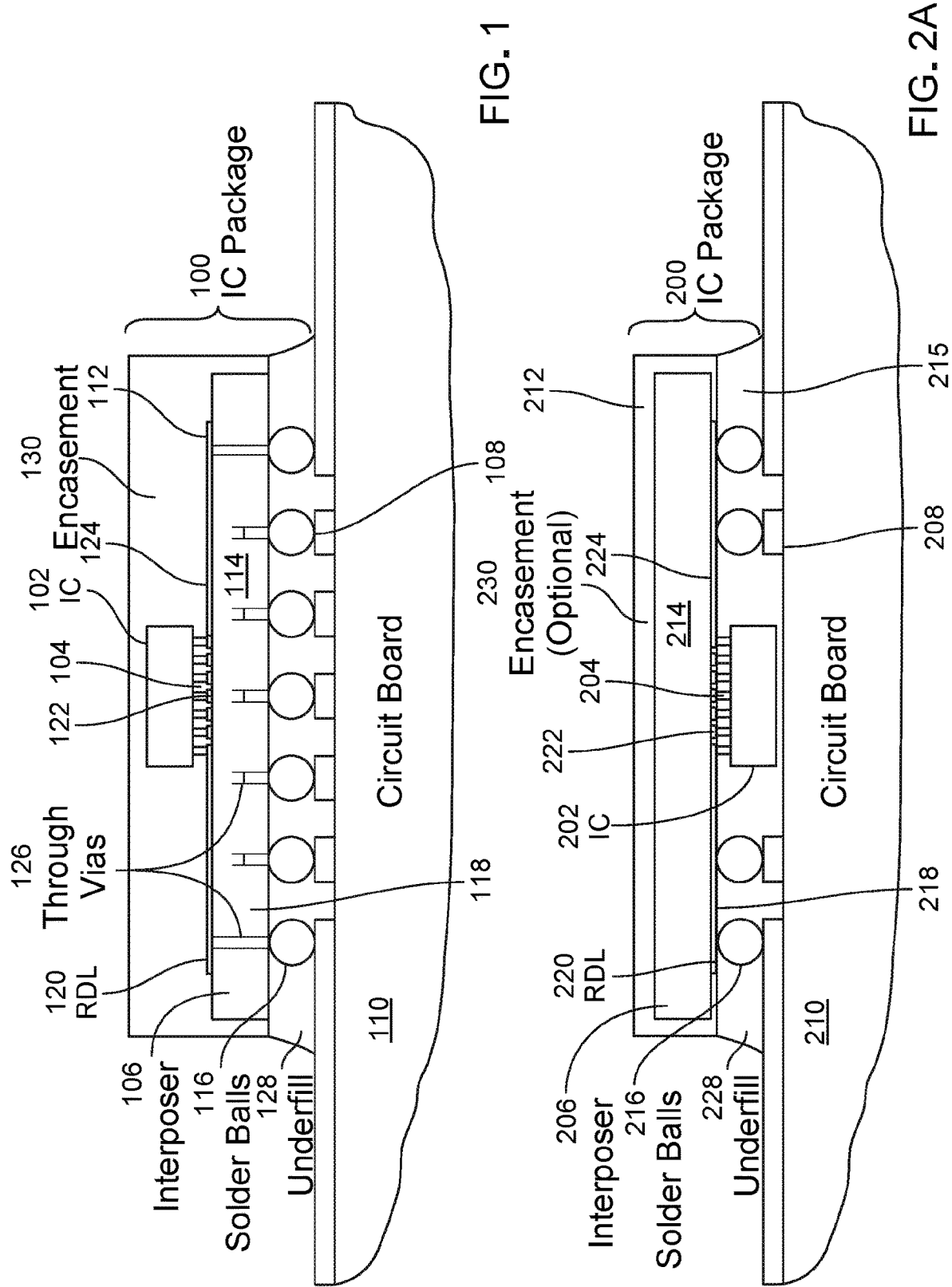

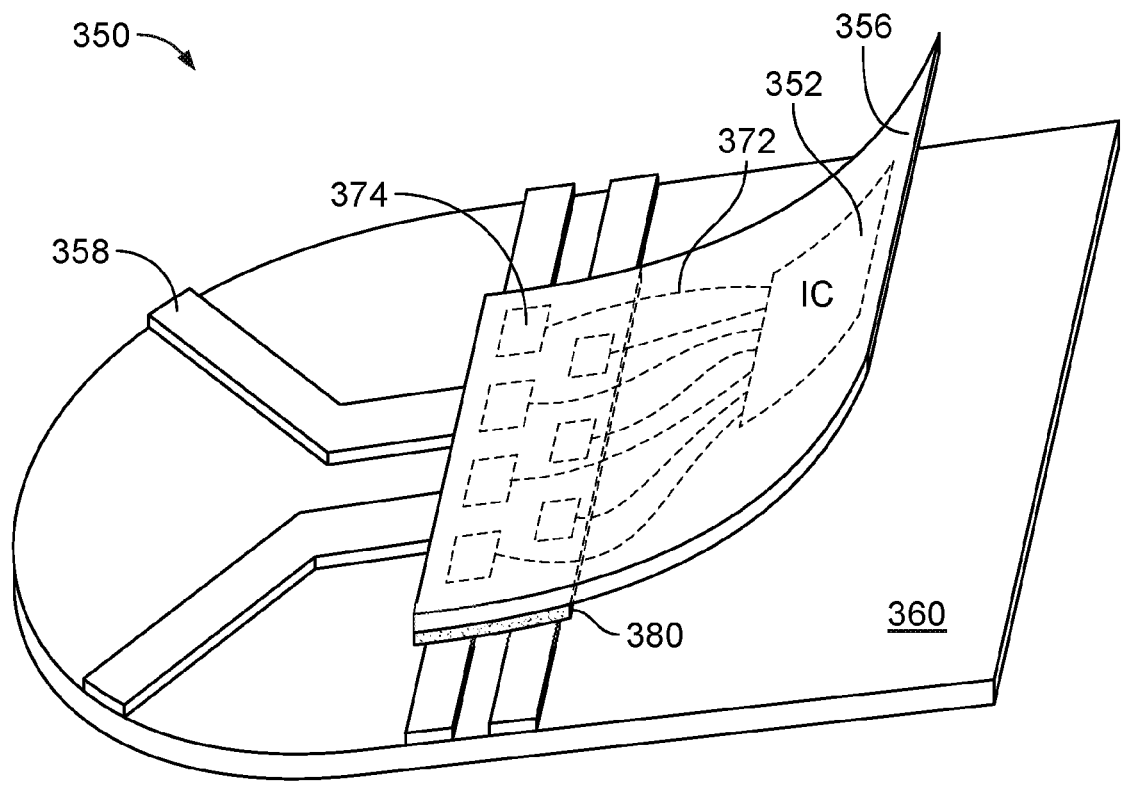

FIG. 12

```
┌─────────────────────────────────────────────┐
│ Connect Bond Pads on Flexible Discrete      │
│ Component to Conductive Lines on Flexible,  │
│ Inverted Interposer                         │
└─────────────────────────────────────────────┘
                      ↓
┌─────────────────────────────────────────────┐
│ Dispose Adhesive Material on Printed Flexible│
│ Circuit Board                               │
└─────────────────────────────────────────────┘
                      ↓
┌─────────────────────────────────────────────┐
│ Contact Adhesive Layer with Inverted Interposer │
└─────────────────────────────────────────────┘
                      ↓
┌─────────────────────────────────────────────┐
│ Cure Adhesive Material                      │
└─────────────────────────────────────────────┘
```

FIG. 13

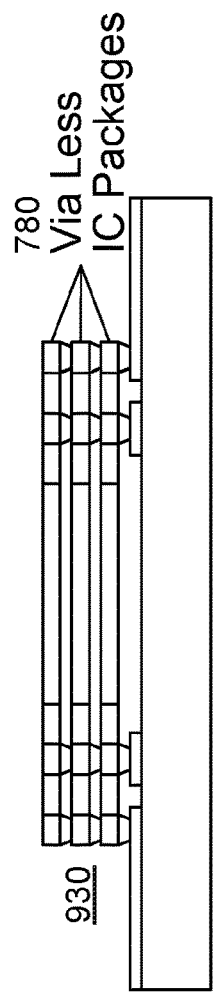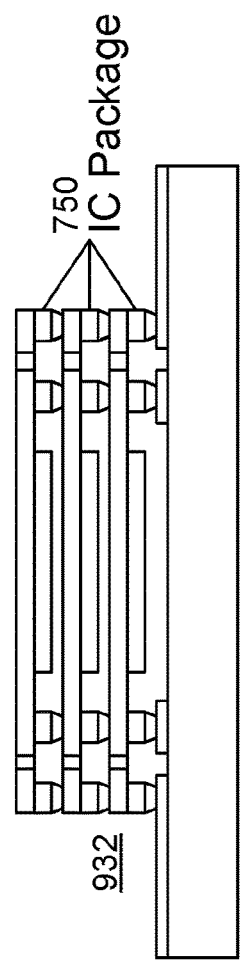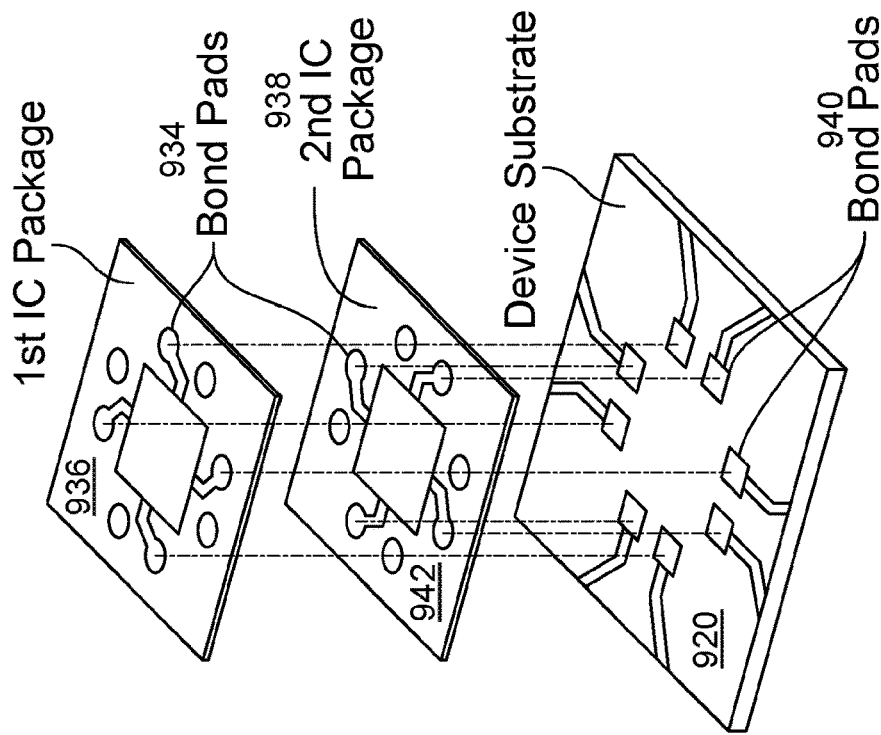
FIG. 19A
FIG. 19B
FIG. 19C

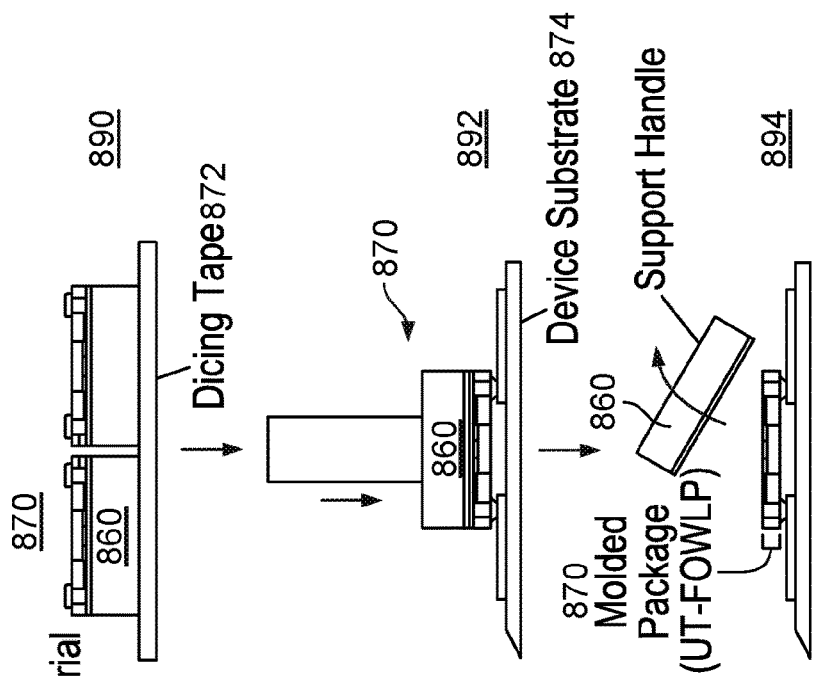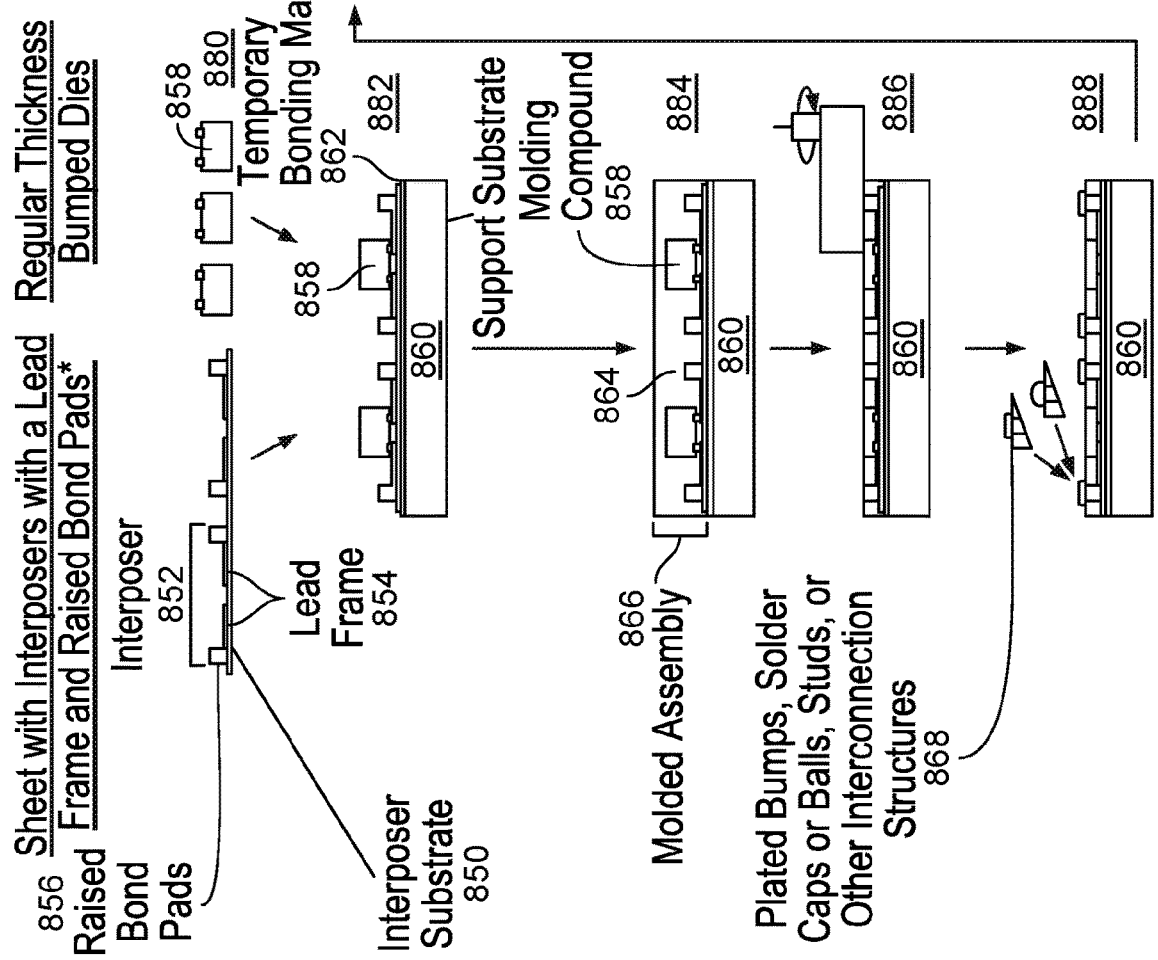
FIG. 20

CONNECTING ELECTRONIC COMPONENTS TO SUBSTRATES

CLAIM OF PRIORITY

This application is a U.S. National Phase Application of International Patent Application No. PCT/US2017/028964, filed on Apr. 21, 2017, which claims the benefit of U.S. Patent Application Ser. No. 62/329,301, filed on Apr. 29, 2016, the entire contents of both of which are incorporated here by reference.

BACKGROUND

Discrete components including integrated circuits are packaged for use in various applications. Packaging a discrete component includes electrically connecting the discrete component to a substrate, such as a printed circuit board.

SUMMARY

In an aspect, an apparatus includes a first substrate including one or more electrical connection features; and an assembly including a second substrate; conductive features in contact with the second substrate, one or more of which are electrically connected to corresponding electrical connection features of the first substrate; and an electronic component between the second substrate and the first substrate and electrically connected to one or more of the conductive features. A separation between the first substrate and the second substrate is 500 µm or less.

Embodiments can include one or more of the following features.

The assembly includes multiple electronic components between the second substrate and the first substrate. The electronic component includes a discrete component. The electronic component includes one or more of a sensor, a MEMS device, an LED, a power source, a chemical sensing element, and a biological sensing element. The electronic component is formed on the second substrate. The electronic component is embedded into a body of the second substrate. The apparatus includes a second electronic component embedded within a body of the second substrate. The electronic component is positioned at a first surface of the second substrate, and in which the assembly includes a second electronic component positioned at a second surface of the second substrate, the second surface opposite the first surface. The first substrate includes a circuit board.

The second substrate includes an interposer. The electronic component includes an integrated circuit.

The one or more conductive features are formed on a surface of the second substrate. A surface of the first substrate faces the surface of the second substrate on which the conductive features are formed and the electronic component is at least partially within a gap between the two surfaces. The surface of the second substrate on which the one or more conductive features are formed faces the first substrate. The gap between the two surfaces is filled with an encapsulant.

At least portions of the one or more conductive features are embedded within a body of the interposer.

The electronic component includes one or more bond pads, at least one of the bond pads electrically connected to a corresponding one of the conductive features of the second substrate. Each bond pad includes a corresponding bump, and in which the at least one of the bond pads is electrically connected to the corresponding one of the conductive features through the bump. The one or more bond pads are formed on a surface of the electronic component. A surface of the electronic component on which the one or more bond pads are formed faces the second substrate. A pitch of the bond pads of the electronic component is different than a pitch of the electrical connection features of the first substrate.

The electronic component is electrically connected to one or more of the conductive features by an interconnection system. The interconnection system includes a conductive adhesive.

Each conductive feature includes a first conductive structure oriented in parallel to a surface of the second substrate and a second conductive structure oriented perpendicular to a surface of the second substrate. The assembly includes an encapsulant layer between the second substrate and the first substrate, and in which the second conductive structures are formed through a thickness of the encapsulant layer. The second conductive structures protrude beyond a bottom surface of the encapsulant layer. The first conductive structures are formed of a different material than the second conductive structures. The first conductive structures include a redistribution structure.

One or more of the conductive features of the second substrate each includes a contact pad connected to a corresponding conductive line. The contact pads are positioned around the edges of the electronic component. The contact pads are arranged in an array. The contact pads are positioned on one side of the electronic component. One or more of the contact pads is each connected to a corresponding electrode, and in which one or more of the electrodes is each electrically connected to a corresponding one of the electrical connection features of the first substrate. The electrodes include one or more of solder balls, pillars, studs, bumps, pads, and conductive particles. The electronic component has a thickness no greater than the combination of a thickness of the electrodes and a thickness of the electrical connection features of the first substrate.

The apparatus includes an underfill material disposed between the first substrate and the second substrate. The underfill material includes a non-conductive polymer.

The electronic component is encapsulated in an encapsulant. At least a portion of the conductive features is encapsulated in the encapsulant.

The separation between the first substrate and the second substrate is 200 µm or less, 100 µm or less, or 50 µm or less. The first substrate is 100 µm or less, 50 µm or less, 25 µm or less, or 10 µm or less from a surface of the electronic component facing the first substrate. The first substrate is in physical contact with the surface of the electronic component facing the first substrate.

The first substrate includes a flexible substrate. The first substrate includes a printed flexible circuit board. The second substrate includes a material that is flexible. The second substrate is stretchable. The one or more conductive features include meandering conductive features. The second substrate includes an elastomeric material. The electronic component includes a material that is flexible. The electronic component has a thickness of less than about 50 µm. The electrical connection features of the first substrate include printed conductors. The apparatus includes an adhesive disposed between the flexible substrate and the assembly. The adhesive includes a conductive adhesive. The adhesive forms a seal around the electronic component. The adhesive includes an anisotropic conductive adhesive. The anisotropic conductive adhesive provides an electrical connection between the conductive features formed on the second substrate and the corresponding electrical connection features of the first substrate.

The assembly includes second conductive features formed through a thickness of the second substrate, each second conductive feature electrically connected to one of the conductive features. The apparatus includes a second electronic component electrically connected to one or more of the second conductive features, the assembly arranged such that the second substrate is disposed between the electronic component and the second electronic component. The apparatus includes a second assembly disposed on the second substrate, the second assembly including a third substrate; third conductive features in contact with the third substrate, one or more of which are electrically connected to corresponding second conductive features of the second substrate; and a second electronic component between the third substrate and the second substrate and electrically connected to one or more of the third conductive features.

The apparatus includes a third substrate disposed on the assembly such that the assembly is between the first substrate and the third substrate, the third substrate including one or more second electrical connection features electrically connected to one or more of the electrical connection features of the first substrate. The apparatus includes an adhesive layer between the first substrate and the third substrate, wherein the assembly is at least partially encapsulated in the adhesive layer. The apparatus includes a second electronic component disposed on the third substrate and electrically connected to one or more of the second electrical connection features. The second electrical connection features are formed through a thickness of the third substrate and in which one or more of the electrical connection features of the first substrate are formed through a thickness of the first substrate. A first surface of the first substrate faces the third substrate, and including a second electronic component disposed on a second surface of the first substrate, the second electronic component electrically connected to one or more of the second electrical connection features.

In an aspect, an assembly includes an electronic component having a first surface at which a pattern of electrical connection features are exposed, a substrate having a substrate surface at which a pattern of electrical connection features are exposed, and an interposer including conductors that connect at least some of the electrical connection features of the electronic component with at least some of the electrical connection features of the substrate, with the electronic component in a space between the interposer and the substrate and the first surface of the electronic component not facing the substrate surface. A second surface of the electronic component is 100 µm or less from the surface of the substrate.

Embodiments can include one or more of the following features.

The electronic component includes an integrated circuit. The conductors are exposed on a surface of the interposer, and in which the surface of the interposer faces the substrate surface. The conductors are electrically connected with the electrical connection features of the electronic component through an interconnection system. Each conductor includes a first conductive feature in physical and electrical contact with the interconnection system and a second conductive feature connecting the first conductive feature to an electrical connection feature of the substrate.

One or more of the conductors of the interposer is each connected to a corresponding electrode that electrically connects the conductor to a corresponding electrical connection feature of the substrate. The electrodes include one or more of solder balls, pillars, studs, bumps, pads, and conductive particles. The electronic component has a thickness that is no greater than the combination of a thickness of the electrodes and a thickness of the electrical connection features of the substrate.

The substrate includes a material that is flexible. The substrate includes an elastomeric material. The substrate is stretchable. The conductors of the interposer include meandering conductors.

The second surface of the electronic component is 50 µm or less, 25 µm or less, or 10 µm or less from the surface of the substrate. The second surface of the electronic component is in physical contact with the surface of the substrate. A separation between the substrate and the interposer is 500 µm or less, 200 µm or less, 100 µm or less, or 50 µm or less.

In an aspect, a method includes electrically connecting an electronic component to one or more conductive features formed on a second substrate; disposing the second substrate on a surface of a first substrate, including positioning the electronic component between the first substrate and the second substrate, in which a separation between the second substrate and the surface of the first substrate is 500 µm or less; and electrically connecting one or more of the conductive features of the second substrate each to a corresponding electrical connection feature of the first substrate.

Embodiments can include one or more of the following features.

Electrically connecting the electronic component includes electrically connecting one or more bond pads of the electronic component each to a corresponding one of the conductive features. Positioning the electronic component between the first substrate and the second substrate includes positioning the electronic component such that a surface including the bond pads faces away from the second substrate.

Electrically connecting the one or more conductive features each to a corresponding electrical connection feature includes applying a stimulus to an adhesive disposed between the first substrate and the second substrate. Applying the stimulus includes applying heat or light. The adhesive includes a conductive adhesive.

The method includes bonding the first substrate to the second substrate. The method includes curing an adhesive disposed between the first substrate and the second substrate.

The first substrate includes a printed circuit board. The first substrate includes a printed flexible circuit board. The second substrate includes an interposer. The electronic component has a thickness that is no greater than the combination of a thickness of the electrodes and a thickness of the electrical contacts of the first substrate.

In an aspect, a method includes disposing one or more electronic components on a first surface of an interposer substrate, in which one or more sets of conductive features are formed on the first surface of the interposer substrate and extend away from the interposer substrate, in which each conductive feature extends to a height of 500 µm or less from the first surface of the interposer substrate, and in which the height of the conductive features is greater than or equal to a height of the electronic components; electrically connecting each electronic component to a corresponding set of conductive features; and separating the interposer substrate into multiple packages, each package including a portion of the interposer substrate, one or more of the electronic components, and the corresponding set of conductive features.

Embodiments can include one or more of the following features.

Each conductive feature extends to a height of 200 μm or less, 100 μm or less, or 50 μm or less from the first surface of the interposer substrate. The conductive features are not formed through a thickness of the interposer substrate.

Separating the interposer substrate into multiple packages includes dicing the interposer substrate. The method includes attaching the interposer substrate to a support substrate. Dicing the interposer substrate into multiple packages includes dicing the support substrate such that each package includes a portion of the support substrate. The method includes attaching the interposer substrate to the support substrate with a temporary bonding material.

The method includes connecting one of the packages to a device substrate such that at least one of the electronic components of the package is disposed between the interposer substrate and the device substrate. Connecting the package to the device substrate includes electrically connecting the conductive features of the package to respective electrical connection features of the device substrate. Connecting the package to the device substrate includes orienting the package such that the electronic component is between the interposer substrate and the device substrate.

The method includes forming molded layer on the surface of the interposer substrate, the molded layer including an encapsulant at least partially covering the electronic components and sets of conductive features. The method includes thinning the molded layer to expose ends of the conductive features. The electronic components include ultra-thin electronic components.

In an aspect, a method includes forming one or more interconnection structures on an interposer substrate, including connecting a first end of each of one or more interconnection structures to corresponding conductive features on a surface of an interposer substrate, in which an electronic component disposed on the surface of the interposer substrate is electrically connected to one or more of the conductive features, and in which a second surface of the electronic component and a second end of each of the interconnection structures are less than 500 μm from the surface of the interposer substrate; disposing the interposer substrate on a device substrate, including positioning the electronic component between the interposer substrate and the device substrate; and electrically connecting the second end of each of one or more of the interconnection structures to a corresponding electrical connection feature of the device substrate.

In an aspect, an apparatus includes a substrate; conductive features formed on a surface of the substrate, each conductive feature having a first end and a second end on the first side of the substrate, in which at least a portion each conductive feature extends away from the substrate, in which each conductive feature extends to a height of 500 μm or less from the surface of the substrate; an electronic component disposed on the surface of the substrate, one or more connection elements on a first surface of the electronic component each electrically connected to the first end of a corresponding one of the conductive features, in which a second surface of the electronic component is 500 μm or less from the surface of the substrate, and in which the height of the conductive features is greater than or equal to the separation between the second surface of the electronic component and the surface of the substrate; and a second end of one or more of the conductive features arranged to each be in electrical contact with a corresponding electrical contact of a circuit board.

Embodiments can include one or more of the following features.

The second surface of the electronic component is 200 μm or less, 100 μm or less, or 50 μm or less from the surface of the substrate. A separation between the surface of the substrate and the circuit board is 500 μm or less, 200 μm or less, 100 μm or less, or 50 μm or less. The second surface of the electronic component is 100 μm or less, 50 μm or less, 25 μm or less, or 10 μm or less from the circuit board. The second surface of the electronic component is in physical contact with the circuit board.

The conductive features are not formed through a thickness of the substrate. The apparatus includes multiple electronic components disposed on the surface of the first side of the substrate. The first ends of the conductive features are electrically connected to the corresponding connection elements of the electronic component through an interconnection system. When the conductive features are in electrical contact with the electrical contacts of the circuit board, the circuit board and the electronic component are both disposed on a same side of the substrate.

The second end of one or more of the conductive features is each in physical contact with a corresponding electrode disposed on the surface of the substrate. The electrodes include one or more of solder balls, pillars, studs, bumps, pads, and conductive particles. The second end of each conductive feature includes a contact pad formed on the surface of the substrate. The second ends of one or more of the conductive features are arranged in an array. The second ends of one or more of the conductive features are positioned around the edges of the electronic component. A pitch of the connection elements of the electronic component is different than a pitch of the electrical contacts of the circuit board.

The apparatus includes a support substrate attached to the substrate such that the substrate is disposed between the electronic component and the support substrate. The support substrate is releasably attached to the substrate. The support substrate is attached to the substrate with a temporary bonding material. The temporary bonding material has an adhesion that changes responsive to application of a stimulus. The substrate includes a material that is flexible. The substrate is stretchable. The electronic component includes a material that is flexible. The apparatus includes an adhesive disposed on the surface of the substrate.

In an aspect, an assembly includes an interposer substrate, multiple sets of conductive features being formed on a surface of the interposer substrate, in which at least a portion of each conductive feature extends away from the interposer substrate, and in which each conductive feature extends to a height of 500 μm or less from the surface of the interposer substrate; and multiple electronic components disposed on the surface of the interposer substrate, each electronic component corresponding to one of the multiple sets of conductive features formed on the surface of the interposer substrate, in which, for each electronic component, one or more connection elements on a first surface of the electronic component are each electrically connected to an end of a corresponding one of the conductive features of the corresponding set, in which a second surface of the electronic component is 500 μm or less from the surface of the interposer substrate, and in which the height of the conductive features is greater than or equal to the separation between the second surface of the electronic component and the surface of the interposer substrate.

Embodiments can include one or more of the following features.

The assembly includes a support substrate, wherein the interposer substrate is disposed between the support substrate and the multiple electronic components.

In an aspect, an apparatus includes a first substrate including one or more electrical connection features; and an assembly including a second substrate; conductive features formed on the second substrate, one or more of which are electrically connected to corresponding electrical connection features of the first substrate; and an electronic component positioned at a surface of the second substrate and electrically connected to one or more of the conductive features, the surface of the second substrate facing the first substrate, in which a separation between the surface of the second substrate and the first substrate is 500 µm or less.

In an aspect, an apparatus includes a first substrate, a first electrical connection feature formed on a surface of the first substrate; and a molded layer including an electronic component and a conductive element encapsulated within a molding material, a second electrical connection feature formed on a surface of the electronic component, the second electrical connection feature of the electronic component being electrically connected to the first electrical connection feature of the first substrate through the conductive element; the surface of the electronic component facing away from the surface of the first substrate.

Embodiments can include one or more of the following features.

The apparatus includes a second substrate attached to the molded layer such that the molded layer is positioned between the first substrate and the second substrate. At least a portion of the conductive element is in physical contact with the surface of the second substrate. The conductive element includes a first conductive feature and a second conductive feature, the first conductive feature formed along a surface of the second substrate, and the second conductive feature formed through a thickness of the molded layer. The second substrate is releasably attached to the molded layer. The second substrate is attached to the molded layer with a temporary bonding material. The temporary bonding material has an adhesion that changes responsive to application of a stimulus. The second substrate is removable from the molded layer by one or more of wet etching, dry etching, and mechanical removal. The method includes a third substrate attached to the second substrate such that the molded layer and second substrate are positioned between the first substrate and the third substrate. The third substrate is releasably attached to the second substrate. The third substrate is attached to the second substrate with a temporary bonding material. The apparatus includes a second conductive element formed through a thickness of the second substrate and electrically connected to the portion of the conductive element. The apparatus includes a second electronic component electrically connected to the second conductive element, in which the second substrate is disposed between the molded layer and the second electronic component. The apparatus includes a second molded layer disposed such that the molded layer is between the second molded layer and the first substrate, the second molded layer including a second electronic component and a third conductive element encapsulated within a molding material, a third electrical connection feature of the second electronic component formed on a surface of the second electronic component, the third electronic feature of the electronic component being electrically connected to the second conductive element of the second substrate through the third conductive element. The surface of the second electronic component faces away from the first molded layer.

The apparatus includes a second substrate disposed such that the molded layer is between the first substrate and the second substrate, the second substrate including one or more third electrical connection features electrically connected to one or more of the first electrical connection features of the first substrate. The apparatus includes a second electronic component disposed on the second substrate and electrically connected to one or more of the third electrical connection features. The third electrical connection features are formed through a thickness of the second substrate and in which one or more of the first electrical connection features of the first substrate are formed through a thickness of the first substrate. The surface of the first substrate faces the second substrate, and including a second electronic component disposed on a second surface of the first substrate, the second electronic component electrically connected to one or more of the third electrical connection features.

The second electrical connection feature of the electronic component is connected to the conductive element through an interconnection system.

The conductive element includes a first conductive element and a second conductive element. The first conductive element is oriented parallel to the molded layer and the second conductive element is oriented perpendicular to the molded layer. A first end of the first conductive feature is in physical contact with an interconnection system that is in contact with the second electrical connection feature of the electronic component, and a second end of the first conductive feature is in physical contact with a first end of the second conductive feature. A second end of the second conductive feature includes an interconnection structure. The interconnection structure includes one or more of solder cap, solder ball, pillar, stud, bump, pad, conductive particle. The interconnection structure includes a conductive adhesive. The interconnection structure is in physical contact with the first electrical connection feature of the first substrate. The second end of the second conductive feature is flush with a bottom surface of the molded layer. The second conductive feature is formed through a thickness of the molded layer. The first conductive feature is exposed on a top surface of the molded layer, the top surface facing away from the first substrate. A top surface of the first conductive feature is coplanar with the top surface of the molded layer. The apparatus includes a second electronic component disposed on the top surface of the molded layer, in which an electrical connection feature of the second electronic component is electrically connected to the exposed first conductive feature.

The electronic component includes an ultra-thin electronic component. The apparatus includes an underfill in a gap between the molded layer and the first substrate. The apparatus includes an assembly including a second electronic component, the assembly disposed on the molded layer such that the molded layer is positioned between the assembly and the first substrate. The molded layer includes multiple conductive elements, and in which the second electronic component is electrically connected to the first substrate through a conductive element. The molded layer includes multiple electronic components encapsulated within the molding material. The multiple electronic components are disposed between the conductive element and the first substrate.

In an aspect, an apparatus includes a first substrate; a molded layer disposed on the first substrate such that a first surface of the molded layer is in contact with the first substrate, the molded layer including an electronic component encapsulated within a molding material, the electronic component having electrical connection features, the electronic connection features facing the first substrate; and conductive elements, each conductive element electrically connected to a corresponding electrical connection feature of the electrical component; in which first ends of the conductive elements are exposed at a second surface of the molded layer and arranged in an arrangement corresponding to an arrangement of electrical contacts of a circuit board.

Embodiments can include one or more of the following features.

The electronic component includes an ultra-thin electronic component. The apparatus includes a second substrate attached to the first substrate such that the first substrate is positioned between the molded layer and the second substrate. The second substrate is releasably attached to the first substrate. The second substrate is attached to the first substrate with a temporary bonding material. The first substrate is releasably attached to the molded layer. The first substrate is removable from the molded layer by one or more of wet etching, dry etching, and mechanical removal. The first substrate is attached to the molded layer with a temporary bonding material.

The apparatus includes an interconnection structure in physical and electrical contact with each of the first ends of the conductive elements. The interconnection structure includes one or more of solder cap, solder ball, pillar, stud, bump, pad, and conductive particle. The interconnection structure includes a conductive adhesive.

Second ends of the conductive elements are in physical and electrical contact with an anisotropic conductive adhesive that is in electrical contact with the electrical connection features of the electronic component. Each conductive element includes a first portion formed on a surface of the first substrate and a second portion formed through a thickness of the molded layer. The apparatus includes an interconnection structure disposed at the first end of each conductive element. The apparatus includes a second conductive element formed through a thickness of the first substrate and electrically connected to at least one of the conductive elements of the molded layer. The apparatus includes a second electronic component electrically connected to the second conductive element, in which the first substrate is disposed between the molded layer and the second electronic component.

In an aspect, an apparatus includes a molded layer including: an electronic component encapsulated within a molding material, the electronic component having electrical connection features, the electronic connection features facing a first surface of the molded layer; and conductive elements, each conductive element electrically connected to a corresponding electrical connection feature of the electrical component; in which first ends of the conductive elements are exposed at a second surface of the molded layer and arranged in an arrangement corresponding to an arrangement of electrical contacts of a circuit board.

Embodiments can include one or more of the following features.

A portion of each conductive element is exposed at the first surface of the molded layer. The apparatus includes a second electronic component disposed on the first surface of the molded layer. The second electronic component is electrically connected to one or more of the exposed portions of the conductive elements. The second electronic component includes one or more of a passive component, a battery, and a sensor. The apparatus includes an interconnection structure in physical and electrical contact with each of the first ends of the conductive elements. The interconnection structure includes one or more of solder cap, solder ball, pillar, stud, bump, pad, and conductive particle. The interconnection structure includes a conductive adhesive. Second ends of the conductive elements are in physical and electrical contact with an anisotropic conductive adhesive that is in electrical contact with the electrical connection features of the electronic component. The apparatus includes a second molded layer disposed facing the first surface of the molded layer, the second molded layer including: a second electronic component encapsulated within a molding material, the second electronic component having second electrical connection features, the second electrical connection features facing a first surface of the second molded layer; and second conductive elements, a second end of each second conductive element electrically connected to a corresponding second electrical connection feature of the electrical component, in which first ends of the second conductive elements are exposed at a second surface of the second molded layer and arranged in an arrangement corresponding to an arrangement of the exposed portions of the conductive elements.

In an aspect, an apparatus includes a molded layer including multiple electronic components encapsulated within a molding material, each electronic component having electrical connection features facing a first surface of the molded layer; and multiple sets of conductive elements, each set corresponding to one of the electronic components, each conductive element of a set electrically connected to a corresponding electrical connection feature of the corresponding electronic component; in which first ends of the conductive elements are exposed at a second surface of the molded layer.

Embodiments can include one or more of the following features.

The apparatus includes a substrate, in which the molded layer is disposed on the substrate such that the first surface of the molded layer is in contact with the substrate. The apparatus includes a support substrate, in which the substrate is disposed on the support substrate such that the substrate is between the support substrate and the molded layer.

The apparatus includes multiple interconnection structures, each interconnection structure in physical and electrical contact with the first ends of a corresponding set of conductive elements. Each interconnection structure includes one or more of solder cap, solder ball, pillar, stud, bump, pad, conductive particle.

The apparatus includes a second electronic component disposed on the first surface of the molded layer. The second electronic component is in electrical contact with at least one of the conductive elements of one of the sets of conductive elements. The apparatus includes multiple second electronic components disposed on the first surface of the molded layer, each second electronic component in electrical contact with at least one of the conductive elements of a corresponding set of conductive elements. The second electronic component includes one or more of a passive component, a battery, and a sensor.

In an aspect, a method includes attaching an interposer substrate to a support substrate, in which multiple sets of conductive features are formed on a surface of the interposer substrate; electrically connecting each of multiple electronic components to a corresponding set of conductive features; forming a molded layer on the surface of the interposer substrate, the molded layer including an encapsulant covering the electronic components and sets of conductive features; thinning the molded layer to expose ends of the conductive features, in which thinning the molded layer includes thinning the electronic components; and separating the thinned molded layer into multiple packages, each package including at least one of the electronic components, and the corresponding set of conductive features.

Embodiments can include one or more of the following features.

Thinning the electronic components includes forming ultra-thin electronic components. The method includes forming an interconnection structure at the exposed end of each of one or more of the conductive features. The interconnection structure includes one or more of a solder cap, a solder ball, a pillar, a stud, a bump, a pad, and a conductive particle. The method includes attaching the interposer substrate to the support substrate with a temporary bonding material.

The method includes connecting one of the packages to a device substrate. Connecting the package to the device substrate includes electrically connecting the conductive features of the package to respective electrical connection features of the device substrate. The method includes removing the support substrate from the interposer substrate of the connected package.

Separating the thinned molded layer into multiple packages includes dicing the interposer substrate and the support substrate such that each package includes a portion of the interposer substrate and a portion of the support substrate. The method includes connecting one of the packages to a device substrate and removing the portion of the support substrate from the portion of the interposer substrate of the connected package. Connecting the package to the device substrate includes orienting the package such that the electronic component is between the portion of the interposer substrate and the device substrate. The method includes assembling a second molded layer onto the portion of the interposer substrate, the second molded layer including a second electronic component encapsulated within a molding material. Assembling the second molded layer includes electrically connecting the second electronic component to a conductive feature formed through a thickness of the portion of the interposer substrate.

The method includes removing the support substrate from the interposer substrate after thinning the molded layer. Separating the thinned molded layer into multiple packages includes dicing the interposer substrate such that each package includes a portion of the interposer substrate. The method includes connecting one of the packages to a device substrate such that the electronic component is between the portion of the interposer substrate and the device substrate. The method includes assembling a second molded layer onto the portion of the interposer substrate, the second molded layer including a second electronic component encapsulated within a molding material. The method includes assembling the second molded layer includes electrically connecting the second electronic component to a conductive feature formed through a thickness of the interposer substrate.

The method includes removing the support substrate from the interposer substrate after forming the molded layer. The method includes removing the interposer substrate from the molded layer. The method includes removing the interposer substrate by one or more of wet etching, dry etching, and mechanical removal. The method includes attaching the molded layer to a second support substrate. Thinning the molded layer includes thinning the molded layer attached to the second support substrate. Separating the thinned molded layer into multiple packages includes dicing the second support substrate such that each package includes a portion of the second support substrate. The method includes connecting one of the packages to a device substrate such that the electronic component is between the portion of the second support substrate and the device substrate. The method includes removing the portion of the second support substrate from the connected package. When the portion of the second support substrate is removed, one or more electrical connection features of the electronic component are exposed on a surface of the electronic component facing away from the device substrate. The method includes assembling one or more second electronic components onto a surface of the electronic component facing away from the device substrate. The method includes assembling a second molded layer onto the molded layer, the second molded layer including a second electronic component encapsulated within a molding material. Assembling the second molded layer includes electrically connecting the second electronic component to one or more of the conductive features in the molded layer. The method includes removing the second support substrate from the thinned molded layer. When second support substrate is removed, the ends of the conductive features are exposed on a first surface of the molded layer and one or more electrical connection features of the electronic component are exposed on a second surface of the molded layer. The method includes assembling one or more second electronic components onto the second surface of the molded layer. The method includes assembling a second molded layer onto the molded layer, the second molded layer including a second electronic component encapsulated within a molding material. The method includes assembling the second molded layer includes electrically connecting the second electronic component to one or more of the conductive features in the molded layer. Assembling the second electronic component includes electrically connecting the second electronic component to at least one of the electrical connection features exposed on the second surface of the molded layer. The method includes connecting one of the packages to a device substrate such that the first surface of the molded layer of the package faces the device substrate.

We use the term discrete component broadly to include, for example, any unit that is to become part of a product or electronic device, for example, electronic, electromechanical, or optoelectronic components, modules, or systems, for example, any semiconductor material having a circuit formed on a portion of the semiconducting material.

Other aspects, features, implementations and advantages will become apparent from the following description and from the claims.

BRIEF DESCRIPTION OF DRAWINGS

FIG. 1 is a diagram of an integrated circuit package.

FIGS. 2A and 2B are side view and top view diagrams, respectively, of an integrated circuit package.

FIG. 12 is a diagram of an integrated circuit package.

FIG. 13 is a flow chart.

FIGS. 19A-19C are diagrams of three-dimensional integrated circuit packages.

FIGS. 20-24 are diagrams of fabrication and assembly of integrated circuit packages.

DETAILED DESCRIPTION

Figure 2B:
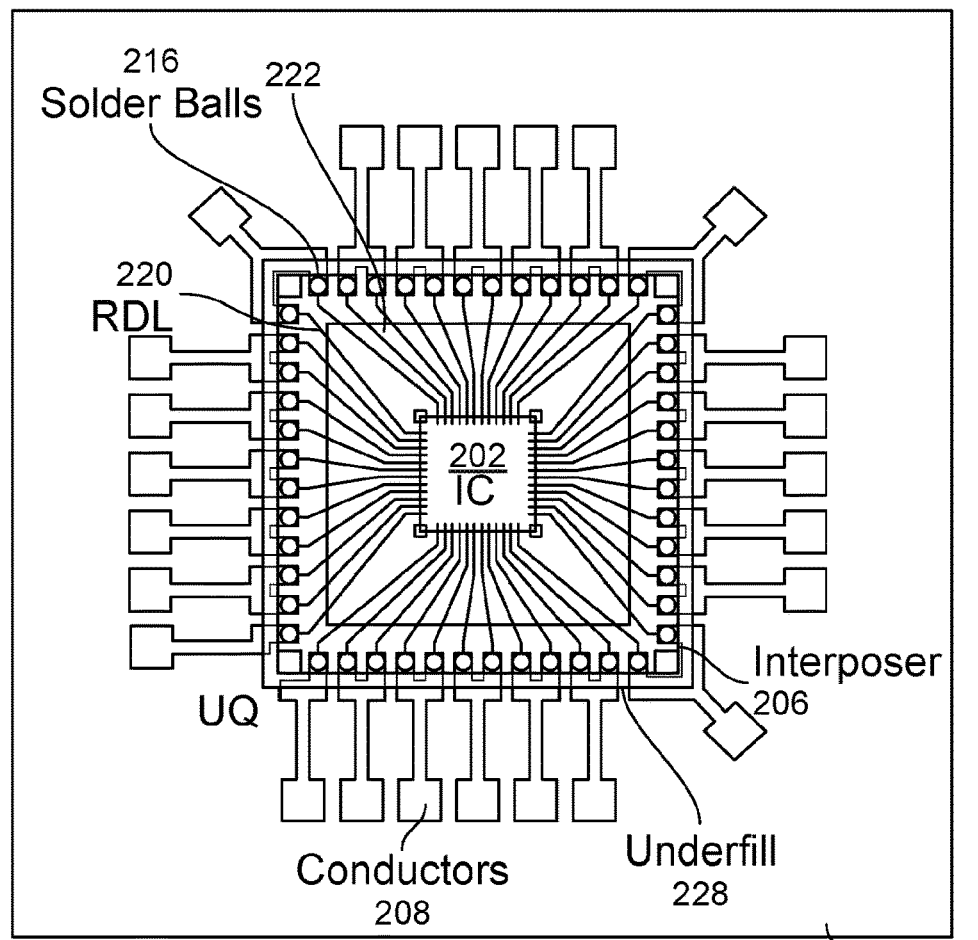

We describe here an approach to connecting electronic components to substrates, such as printed circuit boards. Although this description sometimes refers to printed circuit boards, it is to be understood that other substrates can also be used. One or more electronic components are electrically connected to or formed on an interposer, and the interposer is electrically connected to the printed circuit board such that the one or more electronic components are positioned between the interposer and the printed circuit board. This arrangement enables an arrangement of electrical contacts of the one or more electronic components (e.g., a dense array of high resolution electrical contacts) to be connected with a different arrangement of electrical contacts on the printed circuit board (e.g., a less dense array of lower resolution electrical contacts). In this arrangement, all circuitry can be formed on the same side of the interposer, allowing the length of the signal lines to be reduced, which in turn reduces parasitic capacitance and resistance and improves device performance. In addition, because all circuitry is formed on the same side of the interposer, the package can be created without through vias formed through the body of the interposer, which can contribute to more straightforward manufacturing and a more reliable package.

In some examples, the electronic component can be a discrete component that is fabricated separately and independently from the interposer, disposed on a surface of the interposer, and electrically connected to the interposer. Examples of discrete components can include a semiconductor die that includes one or more integrated circuits, passive components such as resistors, capacitors, inductors, sensors, microelectromechanical (MEMS) devices, light emitting diodes (LEDs), power sources, chemical or biological sensing elements, or other examples, or a combination of any two or more of them.

In some examples, the electronic component can be formed on the surface of the interposer. In some cases, conductive features on the surface of the interposer can be configured into a certain geometry to form the electronic component (e.g., a planar capacitor, a filter, or another type of electronic component). In some cases, the electronic component can be formed on the surface of the interposer by an additive method such as direct write or screen printing (e.g., to form a printed transistor or another type of printed electronic component).

In some examples, the electronic component can be embedded into a body of the interposer during fabrication of the interposer such that the electronic component forms an integral part of the interposer.

Referring to FIG. 1, in a known mounting technique, an integrated circuit (IC) package 100 including an electronic component 102 is mounted on a printed circuit board 110. The electronic component 102 is mounted in a face-down orientation, meaning that bond pads 104 on the electronic component 102 face towards the printed circuit board 110. An interposer 106 disposed between the electronic component 102 and the printed circuit board 110 serves to electrically connect bond pads 104 on the electronic component 102 to electrical connection features, such as contact pads 108, on the printed circuit board.

The pitch and line/space resolution of the bond pads 104 on the electronic component 102 can reflect the pitch and line/space resolution of the circuitry in the electronic component 102. By pitch, we mean the distance between an identical point in two adjacent features in a pattern of repeating features, such as bond pads. Pitch can be viewed as the sum of the width of a feature (e.g., a bond pad) and the width of the space on one side of the feature (e.g., a space filled by a material, such as an insulator) that separates that feature from an adjacent feature. By line/space resolution, we mean the size and spacing of the smallest features on the printed circuit boards, such as the conductor lines. The size of the smallest features can be approximately equal to the smallest line spacing. Features having a large line width and large line spacing are referred to as having a coarse line/space resolution; features having a small line width and small line spacing are referred to as having a fine line/space resolution. Sometimes, the pitch of the bond pads 104 on the electronic component 102 does not match the pitch of the contact pads 108 on the printed circuit board 110 to which the electronic component 102 is to be connected. For instance, some integrated circuits may reach a pitch of 10 microns, but printed circuit boards may not have contact pads 108 with the same pitch. For instance, the contact pads 108 on printed circuit boards are often larger and less closely spaced than the bond pads 104 on electronic components.

The interposer 106 enables the electronic component 102 to be electrically connected to the printed circuit board 110 even if there is a mismatch between the pitch of the bond pads 104 on the electronic component 102 and the contact pads 108 on the printed circuit board 110. In the example of FIG. 1, the electronic component 102 is disposed on a top surface 112 of the interposer 106, and the interposer 106 is disposed on a top surface of the printed circuit board 110. By top surface, we mean the surface of the interposer 106 that faces away from the printed circuit board 110. Circuitry (e.g., conductors) formed through a body 114 of the interposer enables the electronic component 102 to be electrically connected to interface electrodes 116 formed on a bottom surface 118 of the interposer 106, which can contact the contact pads 108 on the printed circuit board 110. By bottom surface, we mean the surface of the interposer 106 that faces the printed circuit board 110.

A redistribution layer (RDL) 120 is disposed on the top surface 112 of the interposer 106 or forms an inner layer of a multilayer interposer. The redistribution layer 120 is formed of a conductive material such as aluminum, copper, gold, silver, or another conductive material, or a combination of any two or more of them. The redistribution layer 120 includes multiple, fine resolution conductive features, such as conductive lines 122. Each conductive line 122 is positioned such that one end of the conductive line aligns with a corresponding one of the bond pads 104 on the electronic component and the other end forms an RDL contact pad 124. The pitch of the RDL contact pads 124 can be greater than the pitch of the bond pads 104 of the electronic component 102. For example, the width of the bond pads 104 can be between about 10 μm and about 1,000 μm and the pitch of the bond pads 104 can be between about 20 μm and about 2,000 μm.

Each RDL contact pad 124 is electrically connected to a conductive vertical interconnect structure 126 (sometimes referred to as a through via 126) formed through the thickness of the body 114 of the interposer 106. We use the term "through via" broadly to include, for example, any vertical interconnect that is used to electrically connect a component on the top surface of a substrate to a component on the bottom surface of a substrate. Each through via 126 connects one of the RDL contact pads 124 formed on the top surface 112 of the interposer 106 to a corresponding one of the interface electrodes 116 formed on the bottom surface 118 of the interposer. The interface electrodes 116 can be, for instance, solder balls, pillars, studs, bumps, pads, conductive particles, or other electrode structures. Each interface electrode 116 contacts a corresponding contact pad 108 on the printed circuit board 110. As a result, an electrical connection is established from each of the bond pads 104 on the electronic component 102, through the thickness of the interposer 106, and to a corresponding contact pad 108 on the printed circuit board 110.

The IC package 100 can be secured to the printed circuit board 110 by an underfill layer 128, such as a non-conductive polymer, e.g., a thermosetting polymer such as an epoxy. The underfill layer 128 can help to resolve thermal mechanical issues arising from the coefficient of thermal expansion (CTE) mismatch between the silicon die or interposer and the printed circuit board to which the IC package is attached. The electronic component 102 and interposer 106 can be encased or encapsulated in a protective case 130, such as a plastic or ceramic case, that can provide mechanical or environmental protection to the electronic component 102 and the circuitry of the interposer 106.

Referring to FIGS. 2A (side view) and 2B (top view), in an IC package 200, an electronic component 202 is mounted on a printed circuit board 210. An inverted interposer 206 electrically connects conductive features, such as bond pads 204, on the electronic component 202 to electrical connection features, such as contact pads 208, on the printed circuit board 210, thus creating an electrical connection between the electronic component 202 and the printed circuit board 210. In the example of FIGS. 2A and 2B, the electronic component 202 is shown as a discrete component. In some examples, the electronic component 202 can be formed on the surface of the inverted interposer 206 or embedded within a body 214 of the inverted interposer 206. In some examples, the inverted interposer 206 can create an electrical connection between multiple electronic components 202 and the printed circuit board 210.

The inverted interposer 206 can be formed of silicon, glass, an organic material, or another material compatible with integrated circuit interconnection and packaging technologies. Example organic materials for the inverted interposer 206 can include polymers such as polyimide (PI), polytetraflouroethylene (PTFE), polyethylene (PET), composite materials such as glass-reinforced epoxy laminate sheets commonly used in printed circuit board fabrication, or a combination of any two or more of them. In the inverted interposer 206, the same surface of the interposer (e.g., a bottom surface 218 of the interposer 206) faces both the electronic component 202 and the printed circuit board 210. In this arrangement, the electronic component is positioned in a gap 215 between the inverted interposer 206 and the printed circuit board 210. The presence of the inverted interposer 206 enables the electronic component 202 to be electrically connected to the printed circuit board 210 even if there is a mismatch between the dimensions of the bond pads 204 on the electronic component 202 and the contact pads 208 on the printed circuit board 210.

A redistribution layer 220 is disposed on the bottom surface 218 of the inverted interposer 206, which is the same surface that faces both the electronic component 202 and the printed circuit board 210. The redistribution layer 220 includes multiple, fine resolution conductive features, such as conductive lines 222, each of which connects one of the bond pads 204 on the electronic component 202 to a corresponding RDL contact pad 224. In some examples, the bond pads 204 can include bumps and the conductive lines 222 connect the bumps of the bond pads 204 to the corresponding RDL contact pads 224. In order for the bond pads 204 or the bumps of the bond pads 204 on the electronic component 202 to contact the redistribution layer 220, the electronic component 202 is disposed in a face-up orientation such that the bond pads 204 on the electronic component 202 face away from the printed circuit board 220.

In some examples, the RDL contact pads 224 can be located toward the periphery of the interposer 206, resulting in a fan-out design of the conductive lines 222. In this arrangement, the contact pads 224 are positioned around the edges of the electronic component 202 such that the electronic component is inside of a shape defined by the contact pads 224. In some examples, the RDL contact pads can be formed into other arrangements, such as arranged in an array. The redistribution layer thus acts as a signal routing structure that routes signals from the bond pads 204 of the electronic component 202 to other locations. In some examples, the RDL contact pads 224 can be formed into an arrangement that aligns with the arrangement of the contact pads 208 on the printed circuit board 210.

Each RDL contact pad 224 can be in direct, physical and electrical contact with a corresponding interface electrode 216, such as a solder ball, pillar, stud, bump, pad, or other electrode structure. Each interface electrode 216 contacts a corresponding contact pad 208 on the printed circuit board 210. As a result, an electrical connection is established from a bond pad 204 on the electronic component 202 to a corresponding contact pad 208 on the printed circuit board 210.

In the IC package 200 of FIG. 2, the electrical connection between the electronic component 202 and the printed circuit board 210 is achieved without the use of through vias through a body 214 of the inverted interposer 206. Rather, the electrical connection is implemented through circuitry that is all formed on the same surface (e.g., the bottom surface 218) of the inverted interposer 206. The absence of through vias allows the IC package 200 to be fabricated using a more straightforward fabrication process, e.g., without the use of lithography and etching process steps used to form through vias through the body 214 of the interposer, thus reducing manufacturing costs. In addition, the formation of all of the circuitry on the same surface of the inverted interposer 206, without the presence of through vias, can result in a more reliable IC package 200.

The formation of all of the circuitry on the same surface of the inverted interposer 206 also reduces the length of the signal lines between the bond pads on the electronic component 202 and the corresponding contact pads 208 on the printed circuit board 210. As a result, the parasitic capacitance and resistance along the signal lines is reduced, and hence the performance of the IC package 200 can be enhanced.

The IC package 200 can be secured to the printed circuit board 210 by an underfill layer 228, such as a non-conductive epoxy. In some examples, the inverted interposer 206 can be encased or encapsulated in a protective case 230, such as a plastic or ceramic case, that can provide mechanical or environmental protection. However, because the electronic component 202 and the circuitry of the inverted interposer 206 are already protected by their position adjacent the bottom surface 218 of the inverted interposer 206, such a protective case can be optional. The absence of a protective case can allow the IC package 200 to be fabricated with fewer process steps and less material, and thus fabrication can be more efficient and less expensive.

In some examples, the IC package 200 using the inverted interposer 206 can be assembled if the height of the electronic component 202 satisfies a criterion, such as that the height of the electronic component 202 plus the bond pads 204 and any desired clearance between the electronic component 202 and the printed circuit board 210 is equal to or smaller than the separation between the bottom surface 218 of the inverted interposer 206 and the printed circuit board 210 (known as the standoff height). For instance, the electronic component 202 can have a thickness that is no greater than the combination of a thickness of the electrodes 216 and a thickness of the contact pads 208 of the printed circuit board 210 less than the height of the bond pads 204. In a specific example, if the expected standoff height after bonding the inverted interposer 206 to the printed circuit board 210 is 50 µm, then the IC package 200 can be compatible with electronic components that are less than about 50 µm thick, less than about 40 µm thick, less than about 30 µm thick, less than about 25 µm thick, less than about 20 µm thick, less than about 10 µm thick, or less than about 5 µm thick.

In some examples, the overall height of the IC package 200 can be less in the configuration shown in FIG. 2 than if components of the same thickness were assembled according to the IC package 100. In the IC package 200, the electronic component 202 is disposed within a space between the bottom surface 218 of the inverted interposer 206 and the printed circuit board 210 that would have existed even without the presence of the electronic component 202. In contrast, in the IC package 100, the electronic component 102 is disposed on the top surface 112 of the interposer 106, increasing the height of the IC package 100 by an amount equal to at least the thickness of the electronic component 102. The low profile of the IC package 200 thus enables the IC package 200 to be used in applications for which thinner components are appropriate.

In the example of FIG. 2, the circuitry of the inverted interposer 206, such as the redistribution layer 220 and the interface electrodes 216, is formed on the bottom surface 218 of the inverted interposer 206. For instance, the redistribution layer 220 can be formed by deposition techniques such as plating, etching, thin film processing techniques, thick film processing techniques, direct write, or other techniques compatible with forming patterned conductors on a substrate.

In some examples, some or all of the circuitry of the inverted interposer 206, such as the redistribution layer 220, can be embedded within the body 214 of the inverted interposer 206. For instance, embedding some or all of the circuitry within the body 214 of the inverted interposer 206 can be useful if a complete electric circuit is formed on the bottom surface of the interposer, thus not allowing sufficient space on the surface of the interposer to create a network of conductors without conductor lines crossing. In an example, a portion of the redistribution layer 220 is buried in the body 214 of the interposer and accessed through blind vias. In some examples, a buried redistribution layer can be used if the pads 204 are arranged in an array pattern in order to allow access to the inner pads.

In some examples, additional electronic components can be disposed or formed on the bottom surface 218, on a top surface 212 of the inverted interposer 206, or both, or can be embedded within the body 214 of the inverted interposer 206.

In some examples, multiple electronic components 202 can be electrically connected to the printed circuit board 210 via electrical connections through a single inverted interposer 206. For instance, multiple electronic components 202 can be positioned between the inverted interposer 206 and the printed circuit board 210. In some cases, one or more electronic components 202 can be positioned between the inverted interposer 206 and the printed circuit board 210 and one or more electronic components can be mounted on the top surface 212 of the inverted interposer 206. In some cases, one or more electronic components can be embedded within the body 214 of the inverted interposer 206. By embedded, we mean formed within the material of the body 214.

Figure 3:
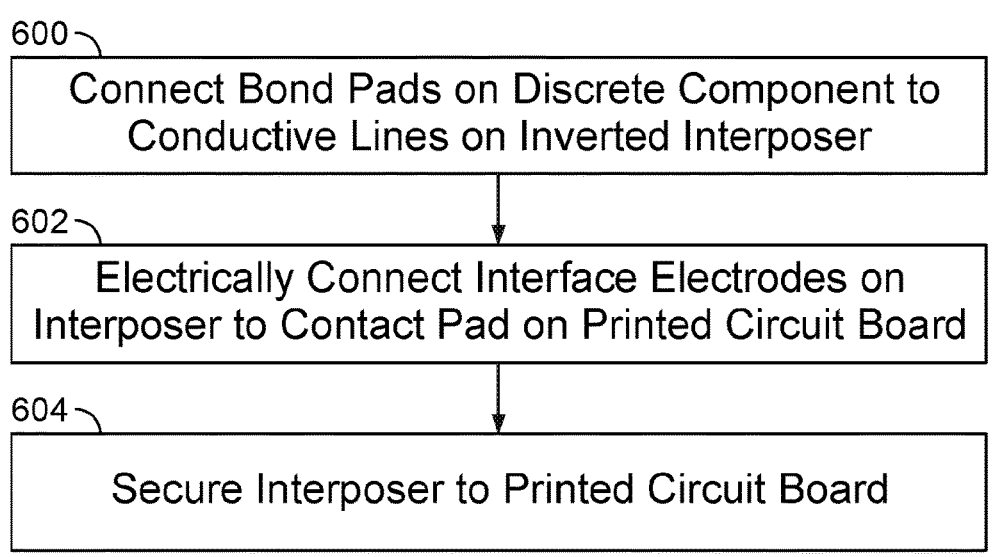
FIG. 3 is a flow chart.

Referring to FIG. 3, in an example approach to assembling an IC package with an inverted interposer, such as the IC package 200, the bond pads on an electronic component are each electrically connected to a corresponding conductive line on a bottom surface of an inverted interposer (600). For instance, the connection can be made using, soldering, adhesive bonding, thermocompression bonding, ultrasonic or thermosonic bonding, diffusion bonding, or other techniques, or a combination of any two or more of them. Each conductive line terminates in a contact pad that is in electrical contact with a corresponding interface electrode disposed on the bottom surface of the inverted interposer. In some examples, the contact pad of a conductive line can be in direct, physical contact with the corresponding interface electrode of the inverted interposer. In some examples, the contact pad can be in electrical contact with the interface electrode via an intermediate conductor, such as conductive adhesive.

The interface electrodes are each electrically connected to a corresponding contact pad on a printed circuit board (602), thus establishing a connection between the electronic component and the printed circuit board. For instance, the connection can be made using soldering, adhesive bonding, thermocompression bonding, ultrasonic or thermosonic bonding, diffusion bonding or other techniques, or a combination of any two or more of them. The IC package is secured to the printed circuit board, for instance, using an underfill layer, such as a non-conductive epoxy (604).

Figure 4A:
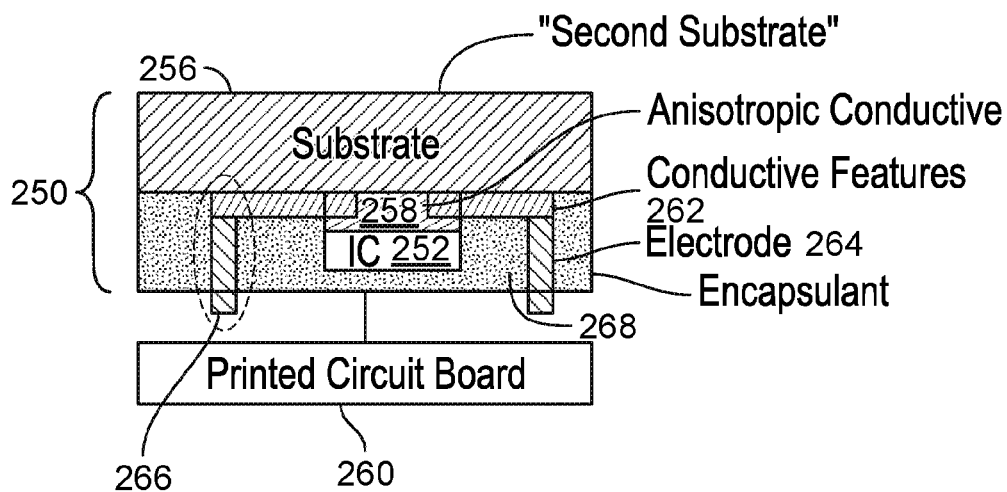
FIGS. 4A-4C are diagrams of integrated circuit packages.

Referring to FIG. 4A, in an IC package 250, an electronic component 252 is mounted on a printed circuit board 260. An inverted interposer substrate 256 electrically connects conductive features on the electronic component 252, such as bond pads or bumps on the bond pads, to electrical connection features on the printed circuit board 260. The IC package is oriented such that the bottom surface of the inverted interposer substrate 256 faces both the electronic component 252 and the printed circuit board 260.

In the IC package 250, the bond pads on the electronic component 252 are in electrical contact with an interconnection system 258. The interconnection system 258 can be an adhesive, such as an anisotropic conductive adhesive, an isotropic conductive adhesive, a conductive adhesive. The interconnection system 258 can be an interconnection formed by soldering, adhesive bonding, ultrasonic or thermosonic bonding, thermocompression bonding, diffusion bonding, or other techniques, or a combination of any two or more of them.

The interconnection system 258 is in turn in electrical contact with a redistribution structure 262. By redistribution structure, we mean a network of conductors, such as metal conductors, that redistributes the bond pads on the electronic component and that conducts electrical signals from the electronic component to the printed circuit board. A redistribution structure can be a three-dimensional structure that has conductors oriented in multiple directions, such as conductors oriented substantially parallel to the surface of the interposer substrate 256 and conductors oriented substantially perpendicular to the surface of the interposer substrate 256. The conductors in the redistribution structure 262 that are oriented substantially perpendicular to the surface of the interposer substrate 256 are oriented away from, rather than through, the interposer substrate 256.

The redistribution structure 262 can include multiple conductive features. Each of the conductive features of the redistribution structure 262 is in electrical contact with a corresponding conductive features of an electrode structure 264. The end 266 of each of the conductive features of the electrode structure 264 is configured to be in electrical contact with a corresponding electrical connection feature on the printed circuit board 260, such as a conductive pad or an electrode structure such as a solder ball, pillar, stud, bump, or other electrode structure. As a result, an electrical connection is established between a bond pad on the electronic component 252 and a corresponding electrical connection feature on the printed circuit board 260. In some examples, the end 266 of one of the conductive features of the electrode structure 264 can be in direct, physical contact with the corresponding electrical connection feature on the printed circuit board 260. For instance, the connection can be made by ultrasonic or thermosonic bonding, thermocompression bonding, diffusion bonding, or other techniques, or a combination of any two or more of them. In some examples, the end 266 of one of the conductive features of the electrode structure 264 can be in electrical contact with the corresponding electrical connection feature via an intermedia conductor, e.g., through a conductor formed by soldering, adhesive bonding, wire bonding, or other techniques, or a combination of any two or more of them.

In some examples, the conductive features of the redistribution structure 262 are oriented to be substantially parallel to the bottom surface of the inverted interposer substrate 256 and the conductive features of the electrode structure 264 are oriented to be substantially perpendicular to the bottom surface of the inverted interposer substrate 256. The conductive features of the electrode structure 264 can be formed into an arrangement that aligns with the arrangement of the electrical connection features on the printed circuit board 260.

In some examples, an encapsulant 268 at least partially surrounds the electronic component 252, the redistribution structure 262, and the electrode structure 264. The encapsulant can be, e.g., a non-conductive polymer, such as liquid or film polymers, e.g., epoxies, silicones, polyimides, or other polymers. In some examples, the ends 266 of the conductive features of the electrode structure 264 can extend beyond a bottom surface of the encapsulant to provide a contact point with the printed circuit board 260. In some examples, the ends 266 of the conductive features of the electrode structure 264 can be flush with the bottom surface of the encapsulant. In some examples, no encapsulant is present.

Figure 4B:
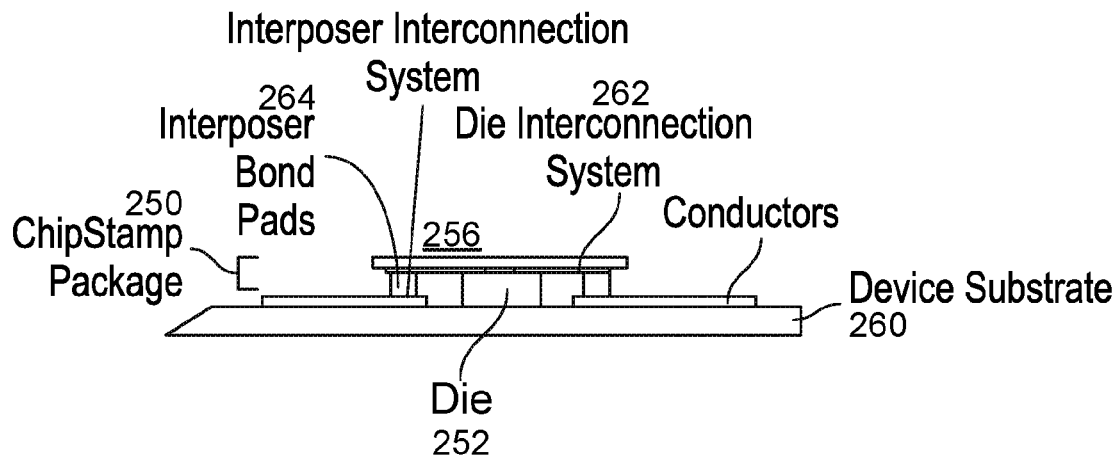
Figure 4C:
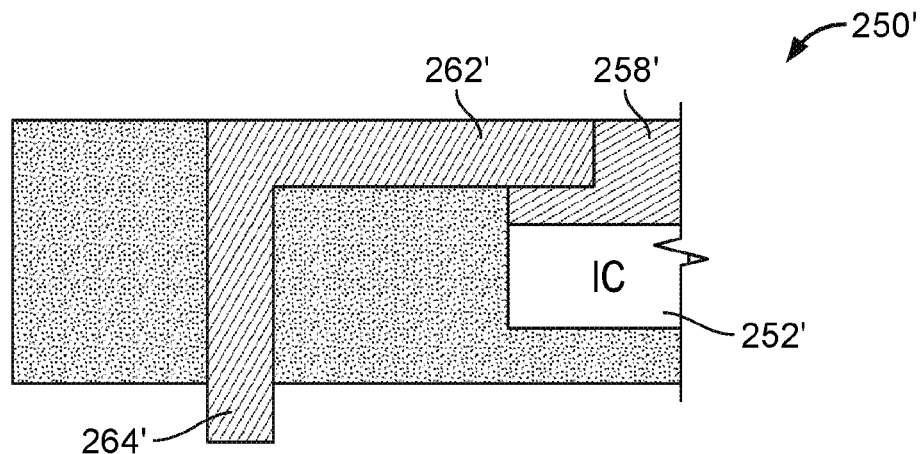

In some examples, the redistribution structure 262 and the electrode structure 264 are formed of the same material, such as aluminum, copper, silver, gold, tin, alloys based on these metals, or another conductive material (e.g., as shown in FIG. 4C). For instance, the redistribution structure 262 and the electrode structure 264 can be a single, integral conductive feature, such as a conductive frame, e.g., a lead frame. In some examples, the redistribution structure 262 is formed of a different material than the electrode structure 264. For instance, the redistribution structure can be a redistribution layer that includes multiple, fine resolution conductive features, such as conductive lines (e.g., such as in the redistribution layer 220 of FIG. 2A), and the electrode structure can include solder balls, pillars, studs, bumps, pads or other electrode structures (e.g., such as the interface electrodes 216 of FIG. 2A).

In some examples, the IC package 252 has a height that equal to or less than the height of the electrode structure 264. In some examples, the sum of the heights of the IC package 252 and the interconnection system 258 is equal or less than the sum of the heights of the redistribution structure 262 and the electrode structure 264.

Referring to FIG. 4B, in some examples, the IC package 250 can be assembled if the height of the electronic component 252 satisfies a criterion, such as that the height of the electronic component 252 plus the redistribution structure 262 and any desired clearance between the electronic component 252 and the printed circuit board 260 is equal to or smaller than the standoff height between the bottom surface of the interposer 256 and the printed circuit board 260.

Referring to FIG. 4C, in some examples, an interposer structure 250' for mounting an electronic component 252' onto a printed circuit board (not shown) does not include a substrate on a top surface of the interposer structure 250'. In this configuration, the top surface of the redistribution structure 262' is exposed and coplanar with the top surface of the encapsulant 268'. This exposure can provide opportunities to assemble additional components on top of the interposer structure 250', thus increasing electronics packaging density. This exposure can allow for the inclusion of additional components, such as passive electronic components (e.g., resistors, capacitors, filters, or other passive components), batteries, sensors, micro-electromechanical systems, or connectors, or other components. This exposure can provide an exposed area for components with which a user can interface, such as displays, optoelectronic components, touch sensors, switches, fingerprint detectors, or other components.

In the example of FIG. 4C, the redistribution structure 262' and the electrode structure 264' are formed of the same material and form a single, integral structure, such as a conductive frame, e.g., a lead frame. In some examples, the redistribution structure 262' and the electrode structure, 264' can be formed of different materials.

The IC packages 250, 250' can be rigid structures or flexible structures, such as structures that incorporate flexible electronic components.

In some examples, the IC package 252' has a height that is equal to or less than the height of the electrode structure 264'. In some examples, the sum of heights of the IC package 252' and the interconnection system 258' is equal to or less than the sum of the heights of the redistribution structure 262' and the electrode structure 264'.

Figure 5:
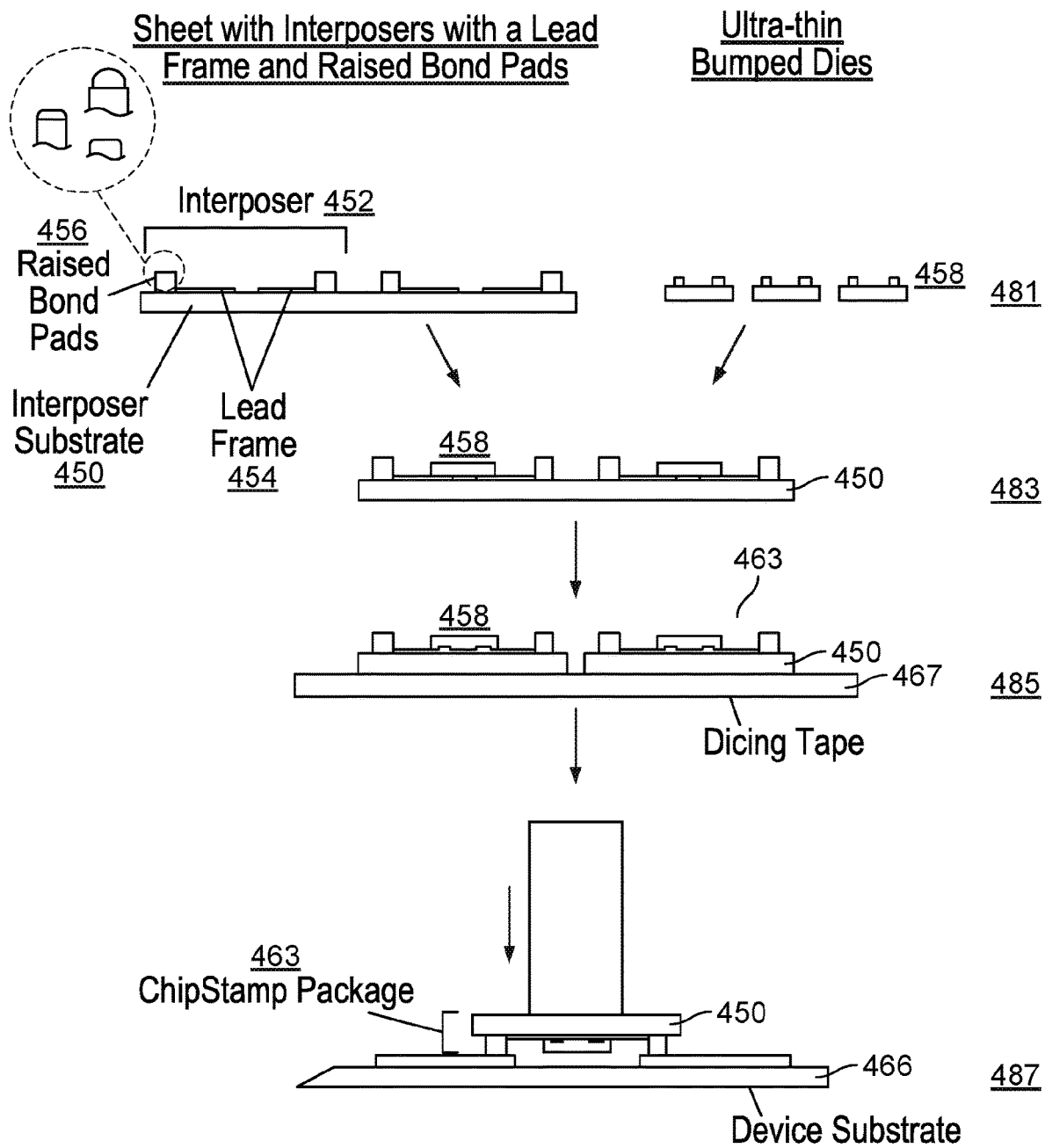
FIGS. 5-8 are diagrams of fabrication and assembly of integrated circuit packages.

Referring to FIG. 5, in an example approach to fabricating and assembling an IC package, such as the IC package 250 of FIG. 4A, an interposer substrate 450 including multiple interposers 452 is provided (481). Each interposer 452 includes a redistribution structure 454 and an electrode structure 456, such as raised bond pads. In the example shown, the redistribution structure 454 and the electrode structure 456 are formed of the same material; in some examples, the redistribution structure and the electrode structure 456 can be formed of different materials, such as to form a conductive frame.

In some examples, the redistribution structure 454 and the electrode structure 456 can be fabricated directly on the interposer substrate 450. In some examples, the redistribution structure 454 and the electrode structure 456 can be fabricated separately and attached to the interposer substrate 450. In some examples, the redistribution structure 454 can be fabricated directly on the interposer substrate 450 and the electrode structure 456 can be fabricated separately and then attached to the interposer substrate 450. The redistribution structure 454 and the electrode structure 456 can be fabricated using the same process or using different processes.

Multiple ultra-thin electronic components 458, such as bumped dies, are also provided. By ultra-thin, we mean having a maximum thickness of 50 µm or less, 40 µm or less, 30 µm or less, 25 µm or less, 20 µm or less, 10 µm or less, or 5 µm or less. The ultra-thin electronic components 458 can be thinned and diced, e.g., as described in PCT Application No. PCT/US2017/013216, the contents of which are incorporated here by reference in their entirety. By bumped, we mean that small conductive bumps are formed on the contact pads of the electronic components.

Each electronic component 458 is assembled into a corresponding interposer 452 using a die assembly method (483), such as contact assembly methods (e.g., pick-and-place methods) or non-contact assembly methods (e.g., thermomechanical selective laser assisted die transfer (tmSLADT)). tmSLADT is described further in PCT Application No. WO2012/142177, WO2016/022528, PCT/US2017/013216, the contents of all of which are incorporated here by reference in their entirety. The bumps on the electronic component 458 are electrically connected to a corresponding conductive feature of the redistribution structure 454 of the interposer 452. Each conductive feature of the redistribution structure 454 is electrically connected to a corresponding conductive feature (e.g., raised bond pad) of the electrode structure 456.

In some examples, the bond pads on the electronic component 458 are in direct, physical contact with the corresponding conductive features of the redistribution structure 454. For instance, the connection can be made using ultrasonic or thermosonic bonding, thermocompression bonding, diffusion bonding, or other techniques, or a combination of any two or more of them. In some examples, the bond pads on the electronic component 458 are in electrical contact with the conductive features of the redistribution structure 454 via an intermediate conductor, such as an intermediate conductor formed by soldering, adhesive bonding, wire bonding, or other techniques, or a combination of any two or more of them.

The assembly of electronic components on interposers is diced into packages 463 (485), e.g., using methods such as blade dicing, laser dicing, plasma dicing, wet etching, or other dicing techniques, or a combination of any two or more of them. Each package including a single interposer 452 with its corresponding electronic component 458. For instance, the stack can be placed on a dicing tape 467 for the dicing.

An individual package 463 is bonded to a device substrate 466, such as a printed circuit board (487), using any of a variety of interconnection methods. For instance, the package 464 can be transferred onto the device substrate 466 using a pick-and-place approach. The conductive features (e.g., raised bond pads) of the electrode structure 456 of the interposer are connected to corresponding conductive features on the device substrate 466 using soldering, adhesive bonding, ultrasonic or thermosonic bonding, thermocompression bonding, diffusion bonding, or other techniques, or a combination of any two or more of them. This bonding establishes an electrical connection from a bond pad on the electronic component 458, through the raised electrode structure 456, and to the conductive feature on the device substrate 466.

Figure 6:
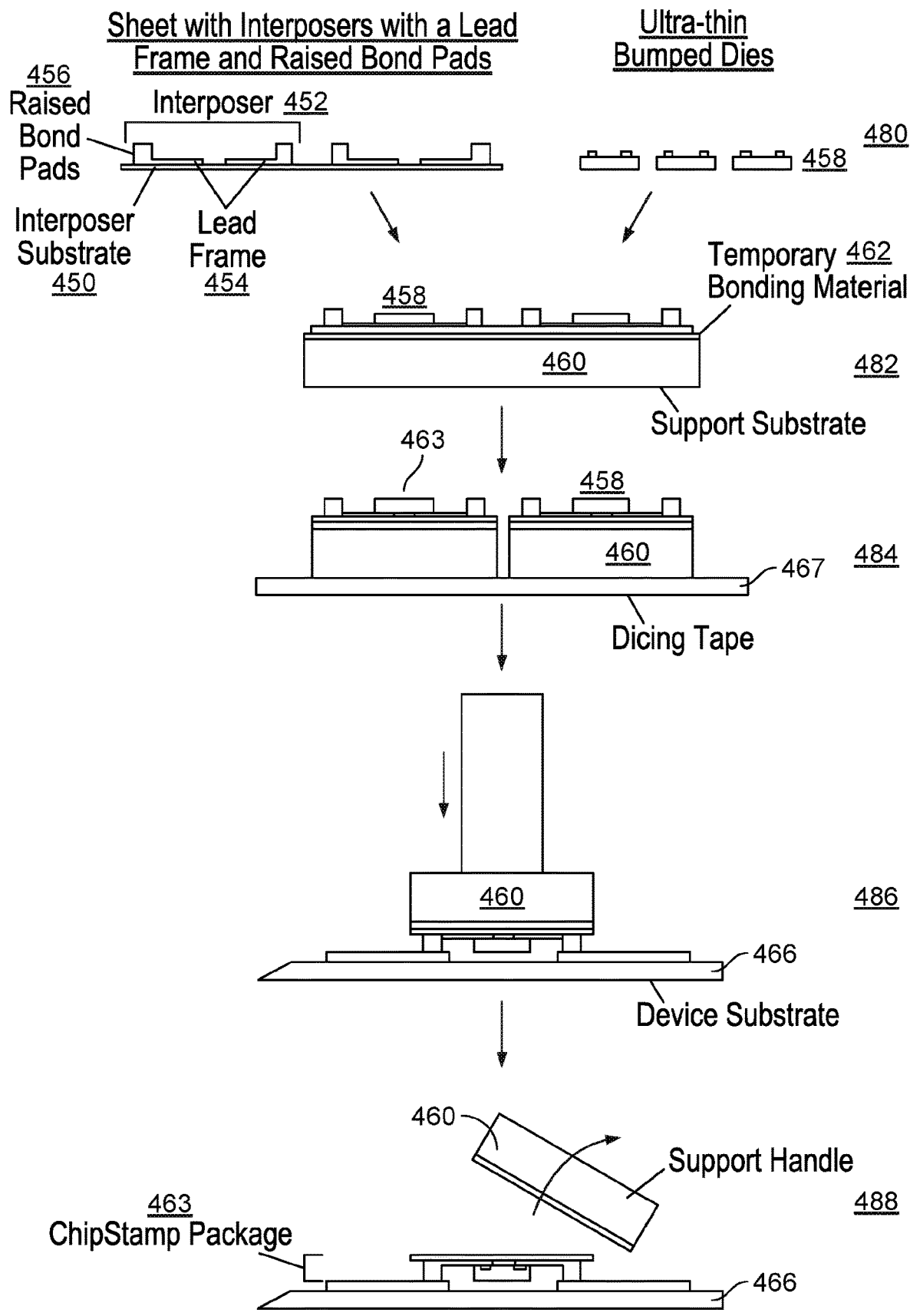

Referring to FIG. 6, in an example approach to assembling an IC package, such as the IC package 250, an interposer substrate 450 including multiple interposers 452 is provided (480). Each interposer 452 includes a redistribution structure 454 and an electrode structure 456, such as raised bond pads. Multiple ultra-thin electronic components 458, such as bumped dies, are also provided.

The interposer substrate 450 is attached to a support substrate 460 with a temporary bonding material 462 (482). The temporary bonding material 462 provides adhesion between the support substrate 460 and the interposer substrate 450 that can be released upon application of a stimulus, such as ultraviolet (UV) light, heat, a normal or shear mechanical force, or another stimulus, or a combination of any two or more of them. Examples of temporary bonding materials that release upon exposure to heat include, e.g., the Valtron® Heat Release Epoxy System by Valtech or the Logitech's OCON-196 Thin Film Bonding Wax. Examples of temporary bonding materials that release upon exposure to UV light include, e.g., polymers with photofunctional groups that change their chemical structure when exposed to UV light. Other examples of temporary bonding materials are provided in PCT Application No. PCT/US2017/013216, the contents of which are incorporated here by reference in their entirety.

Each electronic component 458 is assembled into a corresponding interposer 452 using a die assembly method, such as contact assembly methods (e.g., pick-and-place methods) or non-contact assembly methods (e.g., tmSLADT). The bond pads on the electronic component 458 are electrically connected to a corresponding conductive feature of the redistribution structure of the interposer 452, and each conductive feature of the redistribution structure 454 is electrically connected to a corresponding conductive feature (e.g., raised bond pad) of the electrode structure 456. In some examples, the bond pads on the electronic component 458 can be in direct, physical contact with the corresponding conductive feature of the redistribution structure 454. In some examples, the bond pads can be in electrical contact with the corresponding conductive features of the redistribution structure 454 via an intermediate conductor, such as conductive adhesive.

The stack formed of the support substrate 460 with the interposers 452 and electronic components 458 assembled thereon is diced into packages 464 (484), each package including a portion of the support substrate 460 underlying a single interposer 452 with its corresponding electronic component 458. For instance, the stack can be placed on a dicing tape 467 for the dicing.

An individual package 464 is bonded to a device substrate 466, such as a printed circuit board (486). The conductive features (e.g., raised bond pads) of the electrode structure 456 of the interposer are connected to corresponding conductive features on the device substrate 466 to establish an electrical connection from a bond pad on the electronic component 458, through the electrode structure 456, and to the conductive feature on the device substrate 466.

The support substrate 460 is removed (488). For instance, a stimulus, such as heat, UV light, normal or shear force, or another type of stimulus, can be applied to cause release of the temporary bonding material. The temporary bonding material is also removed, leaving the interposer 452 with connected electronic component 458 assembled on the device substrate. In some examples, an underfill, such as a non-conductive polymer, e.g., an epoxy resin, can be added to fill in the space between the interposer 452 and the device substrate 466.

Figure 7:
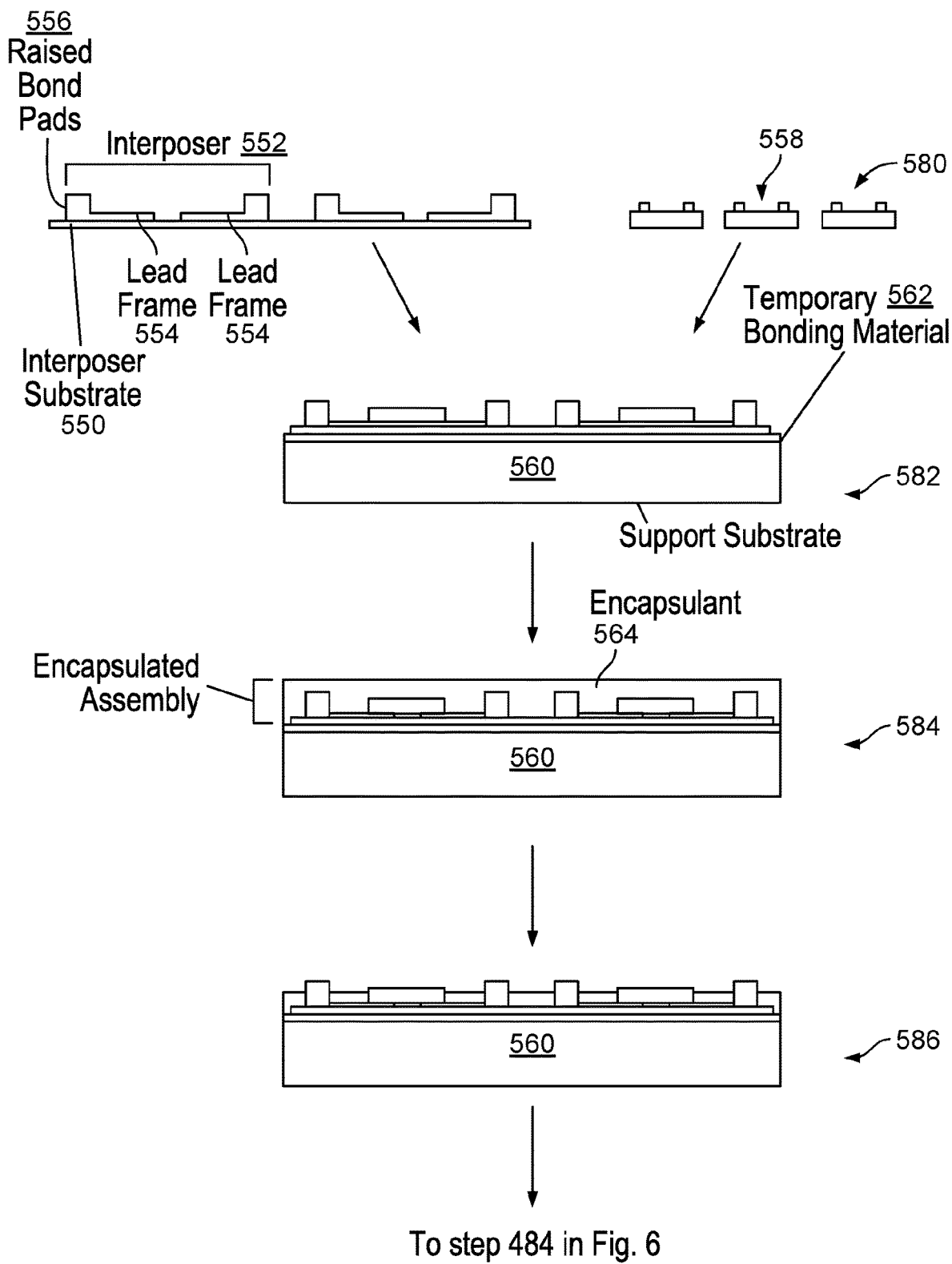

FIG. 7 shows an example approach to assembling an IC package, such as the IC package 250, having a thick layer of encapsulation. An interposer substrate 550 including multiple interposers 552 is provided (580). Each interposer 552 includes a redistribution structure 554 and an electrode structure 556, such as raised bond pads. Multiple ultra-thin electronic components 558, such as bumped dies, are also provided.

The interposer substrate 550 is attached to a support substrate 560 with a temporary bonding material 562 and each electronic component 558 is assembled into a corresponding interposer 552 (582). A layer of an encapsulant 564 is provided to cover the interposers 552 and electronic components 558 (584). The encapsulant 564 can be a curable liquid, a film that is laminated onto the interposer substrate 550, or a powder that is melted to form the encapsulant layer. After deposition, the encapsulant thickness is reduced, e.g., by dry or wet etching or another method, to expose the bond pads 556 of the interposers 552 (586).

Assembly of the encapsulated interposer assemblies proceeds according to steps 484-488, described above in conjunction with FIG. 6.

Figure 8:
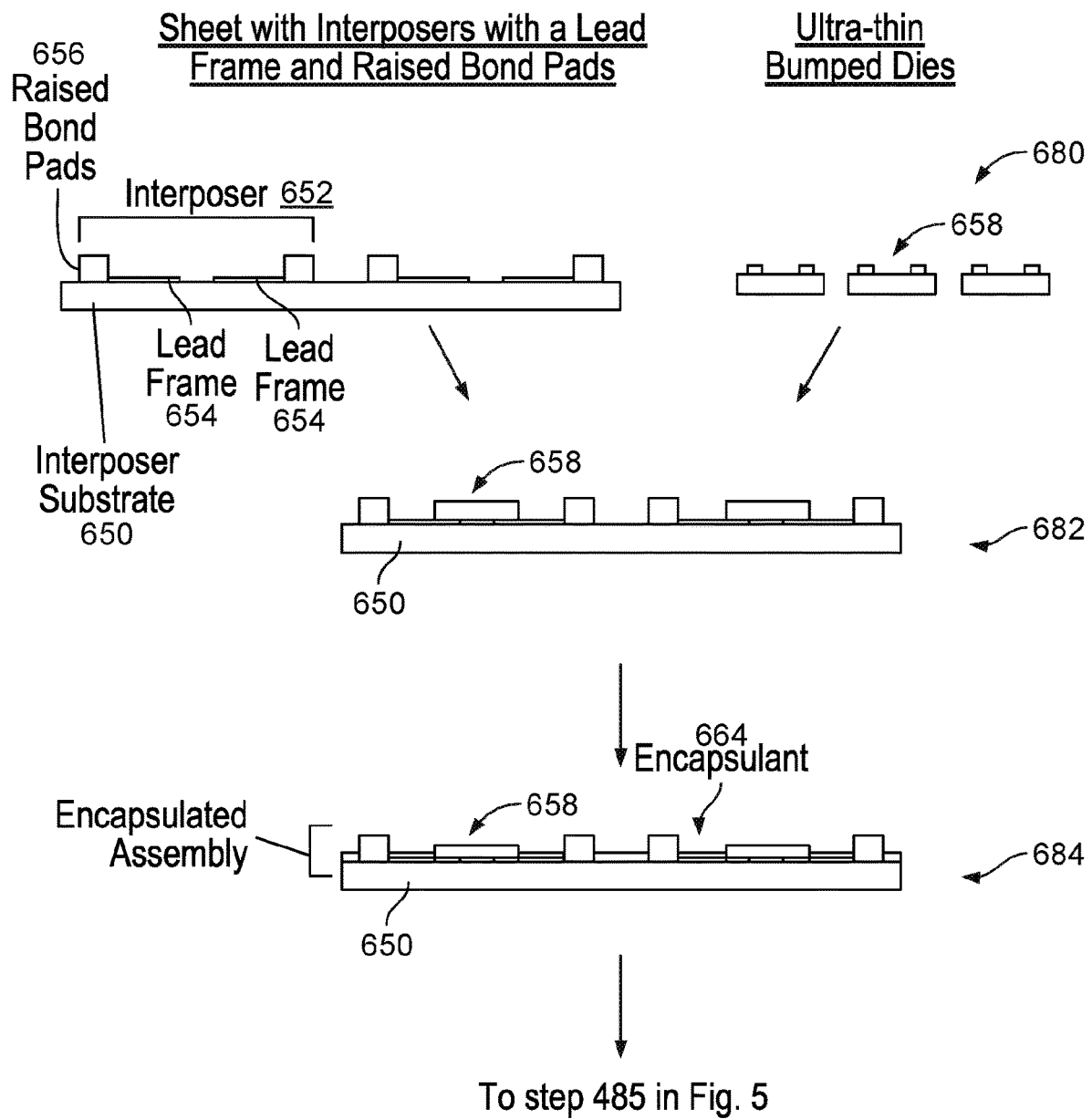

FIG. 8 shows an example approach to assembling an IC package, such as the IC package 250, having a thin layer of encapsulation. An interposer substrate 650 including multiple interposers 652 is provided (680). Each interposer 652 includes a redistribution structure 654 and an electrode structure 656, such as raised bond pads. Multiple ultra-thin electronic components 658, such as bumped dies, are also provided.

Each electronic component 658 is assembled into a corresponding interposer 652 (682). A layer of a curable liquid encapsulant 664 is provided to cover the interposers 652 to a desired thickness (684), such as a thickness that is less than the height of the raised bond pads 656 of the interposers 652. The encapsulant is cured and assembly of the encapsulated interposer assemblies proceeds according to steps 485-487, described above in conjunction with FIG. 5.

Figure 9A:
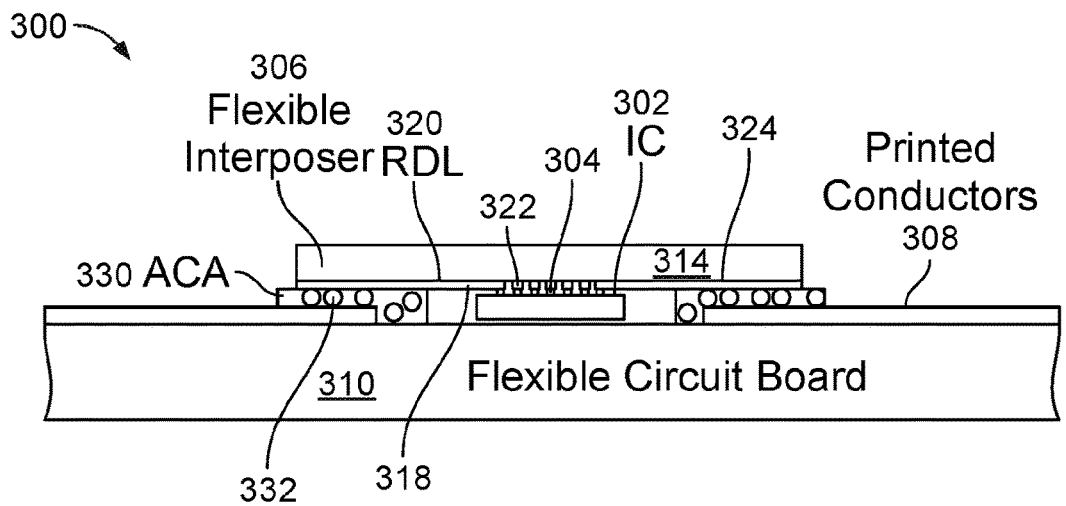
FIGS. 9A and 9B are side view and top view diagrams, respectively, of an integrated circuit package.

Referring to FIGS. 9A (side view) and 9B (top view), in a flexible hybrid electronics (FHE) package 300, a flexible, solid-state electronic component 302 is mounted in a face-up orientation on a flexible circuit board 310. The flexible electronic component 302 can have a thickness of less than about 50 µm, less than about 40 µm, less than about 30 µm, less than about 25 µm, less than about 20 µm, less than about 10 µm, or less than about 5 µm. By flexible, we mean able to bend without breaking and compromising its functionality.

Figure 9B:
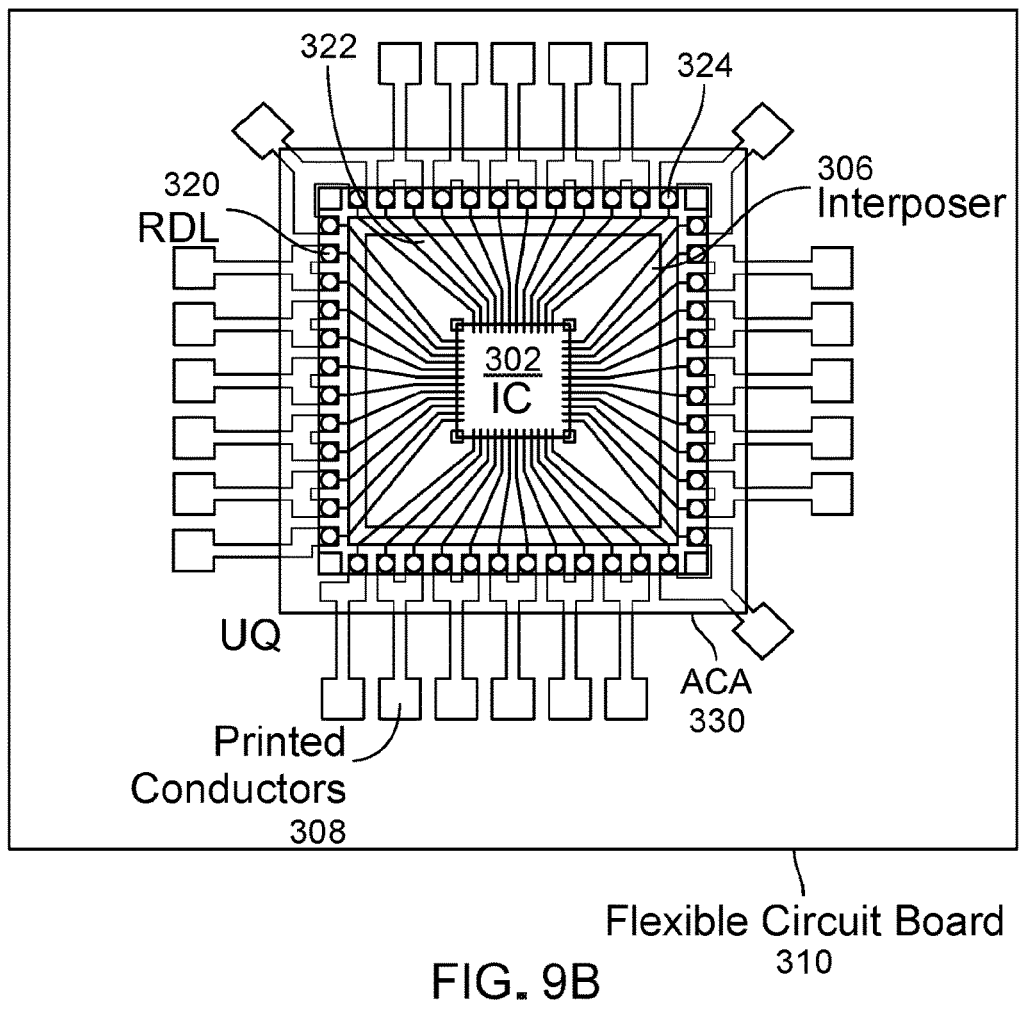

A flexible, inverted interposer 306 (sometimes referred to as a flexible interposer) electrically connects conductive features, such as bond pads 304, on the flexible electronic component 302 to electrical connection features 308 on the flexible circuit board 310, thus creating an electrical connection between the flexible electronic component 302 and the flexible circuit board 310. The electrical connection features can be conductors formed by printing, etching, plating, deposition, or another substrate processing technology, or a combination of any two or more of them. In the example of FIGS. 9A and 9B, the flexible electronic component 302 is shown as a discrete component. In some examples, the flexible electronic component 302 can be formed on the surface of the flexible interposer 306 or embedded within a body 314 of the flexible interposer 306. In some examples, the flexible interposer 306 can create an electrical connection between multiple flexible electronic components 302 and the flexible circuit board 310. The flexible interposer 306 can be formed of a flexible material, such as a polymer, e.g., polyimide (PI), polytetrafluoroethylene (PTFE), polyethylene (PET), or another type of polymer. In the flexible interposer 306, the same surface of the interposer (e.g., a bottom surface 318 of the interposer 306) faces both the flexible electronic component 302 and the flexible circuit board 310, thus achieving electrical connection between the flexible electronic component 302 and the flexible circuit board 310 without circuitry through a body 314 of the flexible interposer 306. In this arrangement, the flexible electronic component 302 is positioned between the flexible interposer 306 and the flexible circuit board 310.

Figure 10:
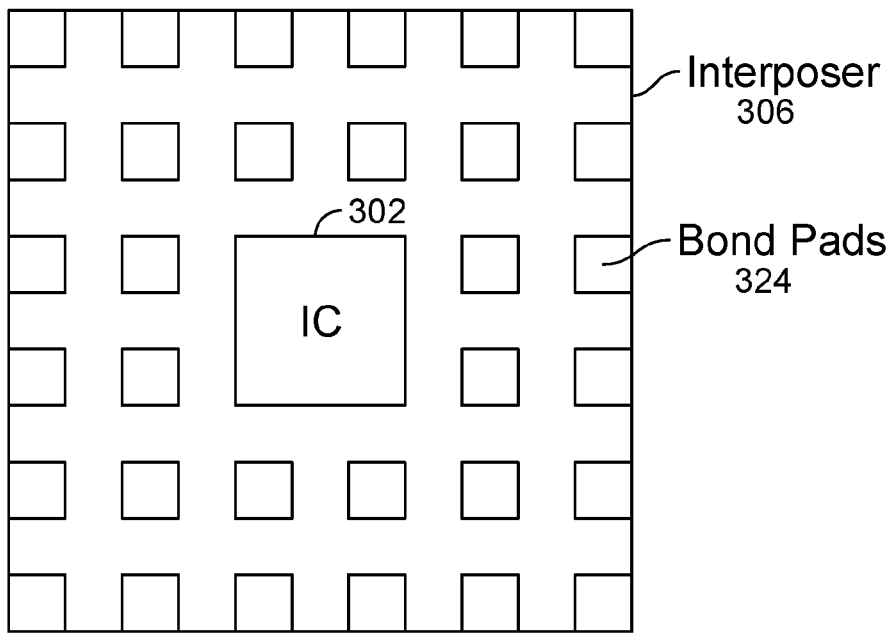
FIGS. 10 and 11 are diagrams of integrated circuit packages.

A redistribution layer 320 is disposed on the bottom surface 318 of the flexible interposer 306. The redistribution layer 320 includes multiple, fine resolution conductive features, such as conductive lines 322, each of which connects one of the bond pads 304 on the flexible electronic component 302 to a corresponding RDL contact pad 324. In the example of FIGS. 9A and 9B, the RDL contact pads 324 are located toward the periphery of the flexible interposer 306, resulting in a fan-out design of the conductive lines 322. In this arrangement, the contact pads 324 are positioned around the edges of the electronic component 302 such that the electronic component is inside of a shape defined by the contact pads 324. In some examples, the RDL contact pads 324 can be formed into other arrangements. For instance, referring to FIG. 10, in an example, the RDL contact pads 324 can be formed into an area array pattern (sometimes also known as a land grid array). In some examples, the RDL contact pads 324 can be formed into an arrangement that aligns with the arrangement of the printed conductors 308 on the flexible circuit board 310.

Each RDL contact pad 324 can be in electrical contact with a corresponding conductor 308 on the flexible circuit board 310. For instance, the flexible interposer 306 can be bonded to the flexible circuit board 310 using a flexible interconnection technology, such as adhesive bonding with a conductive adhesive 330, such as an anisotropic conductive adhesive (ACA), an isotropic conductive adhesive, or a conductive adhesive. As a result, an electrical connection is established from a bond pad 304 on the flexible electronic component 302 to a corresponding—conductor 308 on the flexible circuit board 310. The adhesive 330 can also serve to form a seal, such as an airtight or watertight seal, around the electronic component 302.

When the flexible interposer 306 is bonded to the flexible circuit board 310 using adhesive 330, the spacing between the bottom surface 318 of the flexible interposer 306 and the flexible circuit board 310 is determined based in part on the size of conductive particles 332 in the adhesive 330 and the thickness of the conductors 308. For instance, to achieve a spacing of about 50 µm with printed conductors 308 having a thickness of about 10-20 µm, adhesive 330 with conductive particles 332 having a diameter of about 30-40 µm can be used.

In some examples, adhesive 330 is applied to the flexible circuit board 310 in areas where electrical contact between an RDL contact pad 324 and a printed conductor 308 is to occur (e.g., as shown in FIG. 9A). A stimulus, such as heat, light, pressure, or a combination of any two or more of them, can be applied to selected areas (e.g., in areas where electrical contact between an RDL contact pad 324 and a printed conductor 308 is to occur), in order to achieve adhesive bonding and electrical connection only in those areas. For instance, a thermode having an appropriate shape can be used to apply a heat and pressure to certain areas, or an ultraviolet light source can be used to illuminate certain areas with ultraviolet light.

The FHE package 300, when bonded to the flexible circuit board 310, forms a structure that includes flexible components (the flexible circuit board 310, the flexible interposer 306, and the flexible electronic component 302). The entire assembly is flexible and, in some cases, stretchable (discussed below), and thus compatible with applications for which flexible electronics are appropriate. The flexibility and (in some cases) stretchability enable the assembly to be reliable and resistant to stress. The placement of the electronic component 302 and circuitry between the flexible interposer 306 and the flexible circuit board 310 can further contribute to enhanced reliability of the assembly, e.g., because the electronic component 302 and circuitry are protected from mechanical impact, environmental stimuli or contaminants, or other factors than can be damaging to the sensitive components of the structures.

Although FIGS. 9A and 9B are described with respect to a flexible package, the structure of FIGS. 9A and 9B can also be used for a rigid, ultra-thin package.

In general, the line/space resolution of printed conductor technologies is at least about 10 µm, at least about 20 µm, at least about 30 µm, at least about 40 µm, at least about 50 µm, at least about 60 µm, at least about 70 µm, at least about 80 µm, at least about 90 µm, or at least about 100 µm. Improving the resolution and precision of printed conductors can be challenging and expensive, and thus can be counter to the idea of printed electronics as an inexpensive, high-throughput technology. By using a flexible, inverted interposer to connect an electronic component having a fine pitch (e.g., having sub-100 µm pitch) to a printed circuit board having much coarser line/space resolution, the challenges of improving the resolution of the printed circuit board can be avoided. Integration of fine pitch electronic components can thus be achieved in an inexpensive and efficient manner.

An inverted interposer can be attached to the circuit board using standard methods and tooling, thus making the approaches described here compatible with existing processes and technologies.

The approaches described here can be used to carry out a high assembly rate process to assemble the interposer and electronic component separately from the assembly of the interposer and the printed circuit board. This separation can enable high throughput at relatively low cost, and enables out-of-spec assemblies of interposer and electronic component to be screened out before integration into high cost circuit board assemblies. Furthermore, this separation can make flexible integrated circuits accessible to manufacturers that lack integrated circuit packaging, handling, or test expertise. In addition, this stepwise approach enables faulty components to be easily reworked by replacing one interposer assembly with another.

The fan-out interposer design, such as shown in FIGS. 2 and 9, enables the assembly of thin electronic components (e.g., less than 50 µm thick) of various sizes to be simplified. For instance, the same size interposer can be used with electronic components of various sizes, reducing the need for a large number of bonding tools.

In some examples, such as when the size of the flexible interposer 306 is large and the bend radius small, the flexible interposer 302 can be stretchable. In some examples, the use of a stretchable interposer can depend on the interposer size, bend radius, elastic properties of the adhesive, the thickness or material of the flexible circuit board, or other factors, or a combination of any two or more of them. By stretchable, we mean a material that can increase in dimension (e.g., increase in length, width, or height) without damage and compromise to its functionality. Stretchable interposers can be made of materials such as elastomers, e.g., polydimethylsiloxane (PDMS), silicone rubbers, polyurethane, or other elastomers, or a combination of any two or more of them. Stretchable interposers can be made of materials that have an elongation at break ranging from about 10% to about 500%. When the flexible circuit board 310 is bent, the flexible interposer 306 is subjected to tension forces in addition to the bending forces. The magnitude of these tension forces is proportional to the size of the interposer, for a given thickness of the flexible circuit board 310 and a given bend radius. As a result, a shear stress can develop in the adhesive 330. If the flexible interposer 306 is unable to stretch to accommodate the tension forces, the shear stress may exceed the shear strength of the adhesive material 330, thus causing adhesive failure on the interface between the flexible interposer 306 and the adhesive 330, or in the interface between the flexible circuit board 310 and the adhesive 330, or both, or cohesive failure within the adhesive 330, all resulting in electrical discontinuity between the RDL contact pad 324 and the corresponding conductor 308 on the flexible circuit board 310.

Figure 11:
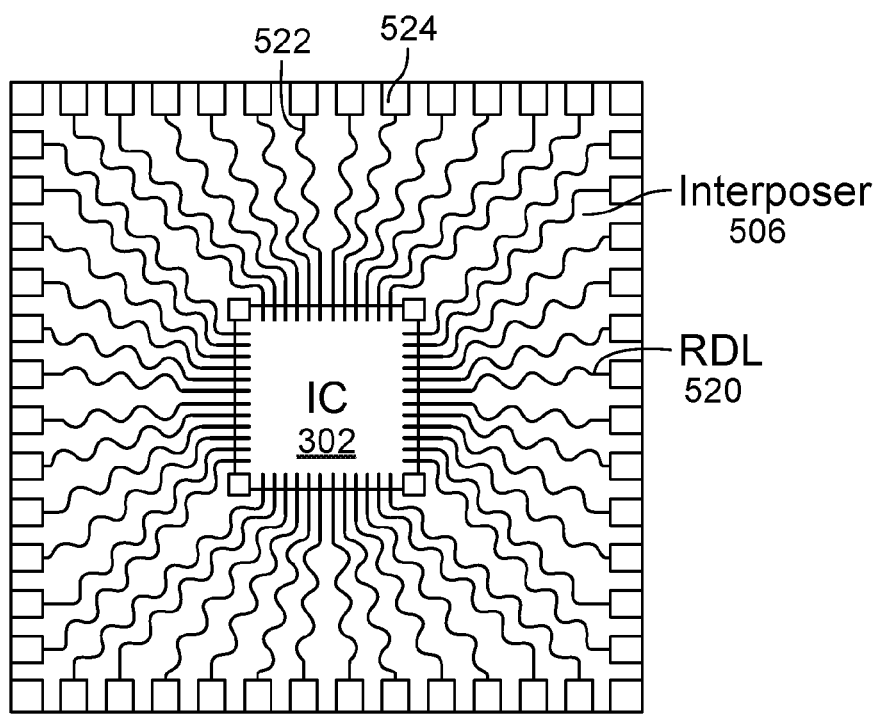

Referring to FIG. 11, an example of a stretchable, flexible interposer 506 includes a redistribution layer 520 having meandering conductive lines 522, each of which terminates at a corresponding RDL contact pad 524. By a meandering line, we mean a line that is not straight and that has multiple changes in direction. The meandering configuration of the conductive lines 522 enables the conductive lines 522 to sustain a certain amount of stretching without comprising their mechanical and electrical integrity. Thus, even when the stretchable, flexible interposer 506 stretches responsive to a bending of a flexible circuit board to which it is attached, the conductive lines can remain intact.

Referring to FIG. 12, in a flexible hybrid electronics package 350, a flexible, solid-state electronic component 352 is mounted in a face-up orientation on a flexible circuit board 360. A flexible, inverted interposer 356 (sometimes referred to as a flexible interposer) electrically connects bond pads (not shown) on the flexible electronic component 352 to conductors 358 on the flexible circuit board 360. An adhesive 380 connects the flexible interposer 356 to the flexible circuit board 360.

A redistribution layer (not shown) is disposed on the bottom surface of the flexible interposer 356. The redistribution layer includes multiple, fine resolution lines 372, each of which connects one of the bond pads on the flexible electronic component 352 to a corresponding RDL contact pad 374. Each RDL contact pad 374 can be in electrical contact with a corresponding one of the conductors 358 on the flexible circuit board 360, thus establishing an electrical connection between the flexible electronic component 352 and the flexible circuit board 360.

In the example of FIG. 12, the RDL contact pads 374 are all located towards the same side of the flexible interposer 356. As a result, the other side of the flexible interposer can be free to bend. This design can be useful, e.g., to attach flexible interposers having a relatively small number of RDL contact pads 374 to flexible circuit boards. In this design, the bending and tensile stresses are confined to the region of the adhesive 380, which is much smaller than the size of the entire flexible interposer 356.

Referring to FIG. 13, in an example approach to assembling an FHE package with an inverted interposer, the bond pads on a flexible electronic component are each electrically connected to a corresponding conductive line on a bottom surface of a flexible, inverted interposer (700). Each conductive line terminates in a contact pad.

A complete or partial layer of an adhesive material is disposed on the surface of a flexible circuit board (702). The conductive adhesive may be isotropic conductive adhesive (ICA), anisotropic conductive paste (ACP), anisotropic conductive film (ACF), or another type of conductive adhesive. ICA and ACP are dispensed onto the substrate by methods such as stencil and screen printing, stamping, syringe and jet deposition, or other methods. ACF is precut and adhesively bonded to the substrate. The inverted interposer, including the electrically connected electronic component, is brought into contact with the layer of adhesive material on the flexible circuit board (704) such that the bottom surface of the inverted interposer faces the flexible circuit board. The adhesive material is cured (706), e.g., by application of a stimulus such as light, heat, pressure, or a combination of any two or more of them, such that an electrical connection is established between each contact pad on the bottom surface of the flexible interposer and a corresponding conductor on the flexible circuit board.

Figure 14:
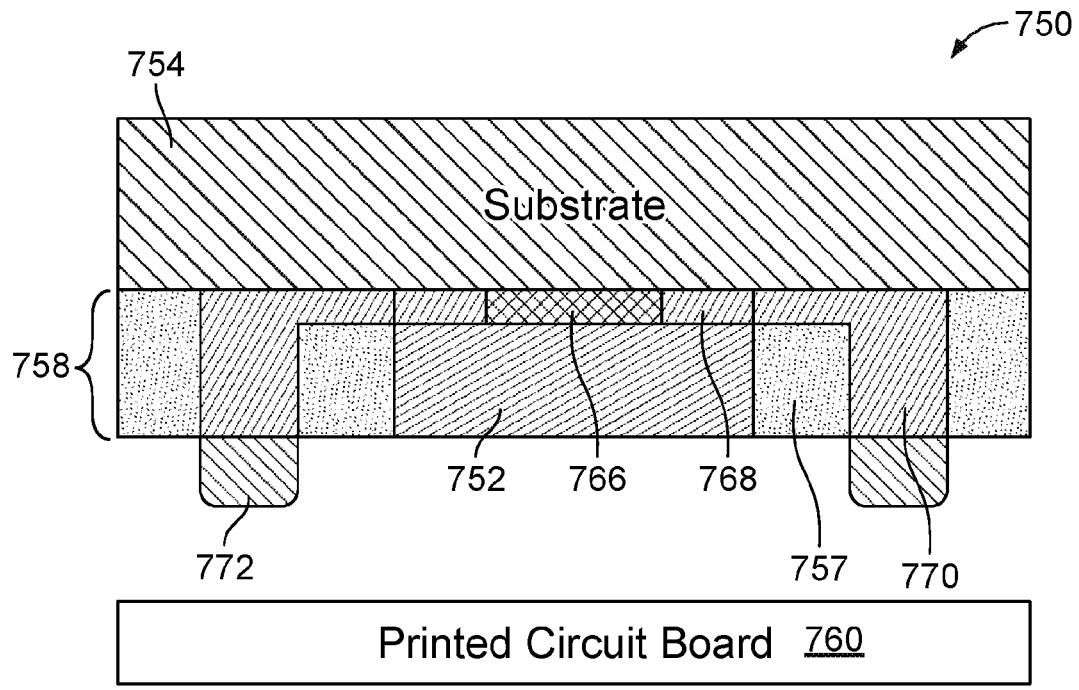
FIGS. 14-17 are diagrams of integrated circuit packages.

Referring to FIG. 14, in an IC package 750, an ultra-thin electronic component 752 is mounted on a printed circuit board 760. A layer 758, mounted on an interposer substrate 754, includes the ultra-thin electronic component 752 embedded in a molding compound 757, such as a non-conductive polymer, e.g., liquid, sheet, or powdered thermoplastic or thermosetting molding compounds such as an epoxy resin heavily filled with $SiO_2$. The layer 758 can be thin enough to be flexible when standing on its own. First and second conductive elements 768, 770 embedded in the molding compound 758 provide for an electrical connection to be formed between the electronic component 752 and the printed circuit board 760. For instance, the first conductive elements 768 can be a redistribution structure such as the redistribution structure 262 of FIG. 4, and the second conductive elements 770 can be an electrode structure such as the electrode structure 264 of FIG. 4.

An interconnection system 766 is in direct physical and electrical contact with conductive features, such as bond pads or bumps, on the electronic component 752. The interconnection system 766 is also in direct physical and electrical contact with the first conductive features 768 that include multiple, fine resolution conductive features, such as conductive lines. The interconnection system 766 can be an adhesive, such as an anisotropic conductive adhesive, an isotropic conductive adhesive, a conductive adhesive. The interconnection system 766 can be an interconnection formed by soldering, adhesive bonding, ultrasonic or thermosonic bonding, thermocompression bonding, diffusion bonding, or other techniques, or a combination of any two or more of them.

Each conductive element 768 is positioned such that a first end of the conductive line is positioned to be in electrical contact with a corresponding conductive feature on the electronic component 752 via the interconnection system 766. A second end of each conductive element 768 is in electrical contact with a corresponding one of the second conductive elements 770. In some examples, the second end of each conductive element can be in direct, physical contact with the corresponding second conductive element. In some examples, the second end of each conductive element can be in electrical contact with the corresponding second conductive element via an intermediate conductor, such as conductive adhesive.

The second conductive elements 770 are vertical electrode structures formed through the thickness of the molding compound 757. The end of each second conductive element 770 is coplanar with a bottom surface of the molding compound 757, and is connected to an interconnection structure 772, such as a solder cap, solder ball, pillar, stud, bump, pad, conductive particle, or other interconnection structure. When assembled onto the printed circuit board 760, each interconnection structure 772 contacts a corresponding contact pad on the printed circuit board 760. As a result, an electrical connection is established from a conductive feature on the electronic component, through the first and second conductive elements, and to a corresponding contact pad on the printed circuit board 760.

In some examples, the first and second conductive elements 768, 770 are formed of the same material. For instance, each pair of first and second conductive elements 768, 770 can be a single, integral conductive element, such as a redistribution structure. In some examples, the first conductive elements 768 are formed of a different material than the second conductive elements 770.

Figure 17:
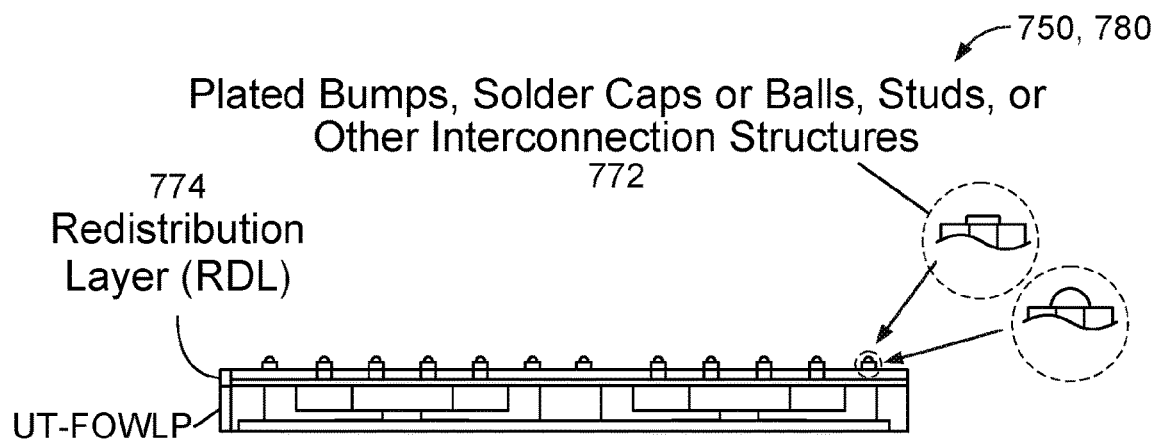

The bottom surface of the molding compound 757 can be finished with a high degree of flatness and smoothness. This allows for an additional redistribution structure to be formed on the bottom surface of the molding compound 757, thus enabling a denser distribution of interconnection structures 772 to be achieved over the entire bottom surface of 757. For instance, interconnection structures 772 can be formed on the bottom surface of the electronic component 752, e.g., as illustrated in FIG. 17 below.

Figure 15:
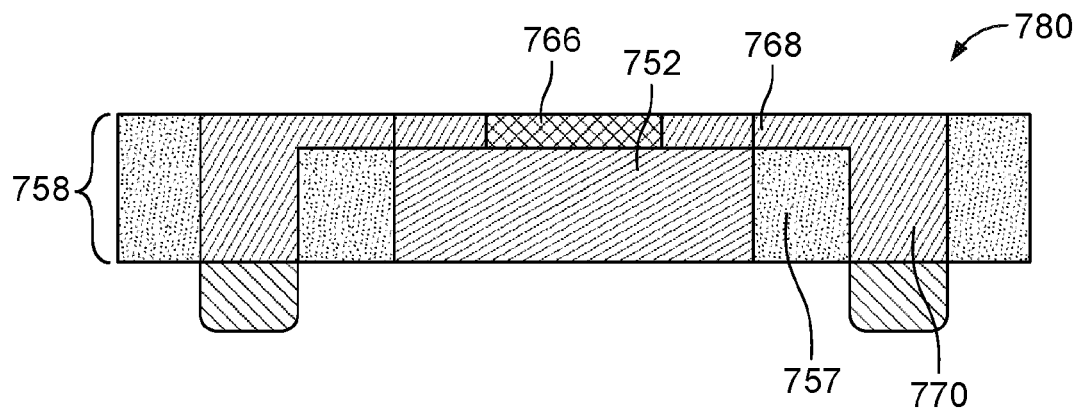

Referring to FIG. 15, in some examples of an IC package 780, the layer 758 including the electronic component 752 embedded therein is provided without the overlying substrate (754 in FIG. 14). In this configuration, the top surface of the first conductive elements 768 is exposed and coplanar with the top surface of the molding compound 757. This exposure can provide opportunities to assemble additional components on top of the layer 758, thus increasing electronics packaging density. This exposure can allow for the inclusion of thicker components that otherwise would be difficult to fit into the IC package 780, such as passive components, batteries, sensors, or connectors, or other thick components. This exposure can provide an exposed area for compounds with which a user can interface, such as displays, touch sensors, switches, fingerprint detectors, or other components.

The IC packages 750, 780 can be rigid structures or flexible structures, such as structures that incorporate flexible electronic components.

Figure 16:
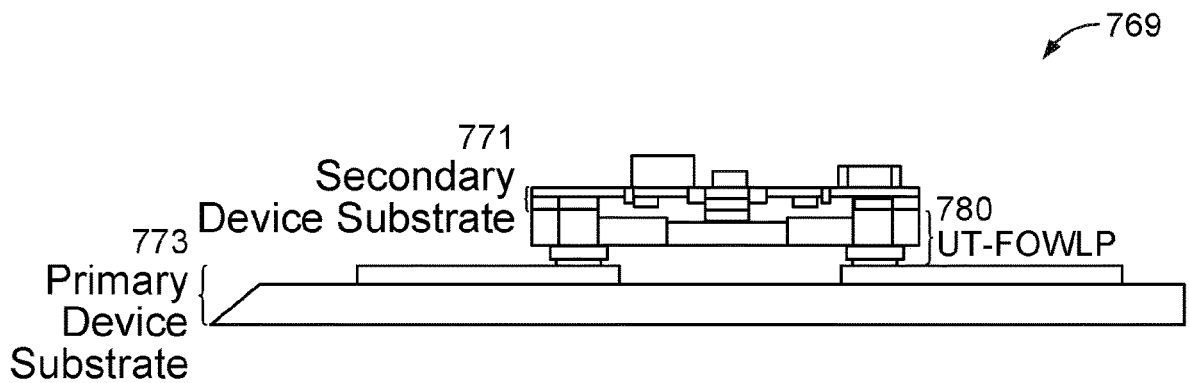

Referring to FIG. 16, with the conductive elements 768 exposed, the backside of the IC package 780 can serve as a substrate for assembly of other electronic components. For instance, a three-dimensional assembly 769 can include an electronic circuit containing one or more components mounted on a secondary device substrate 771 that electrically connected to the exposed conductive elements 768 of a first IC package 780, and together mounted onto a device substrate 773.

Referring to FIG. 17, in some examples, the IC package 750, 780 is provided with a pad redistribution structure 774 to which the interconnection structure 772 is connected.

Figure 18:
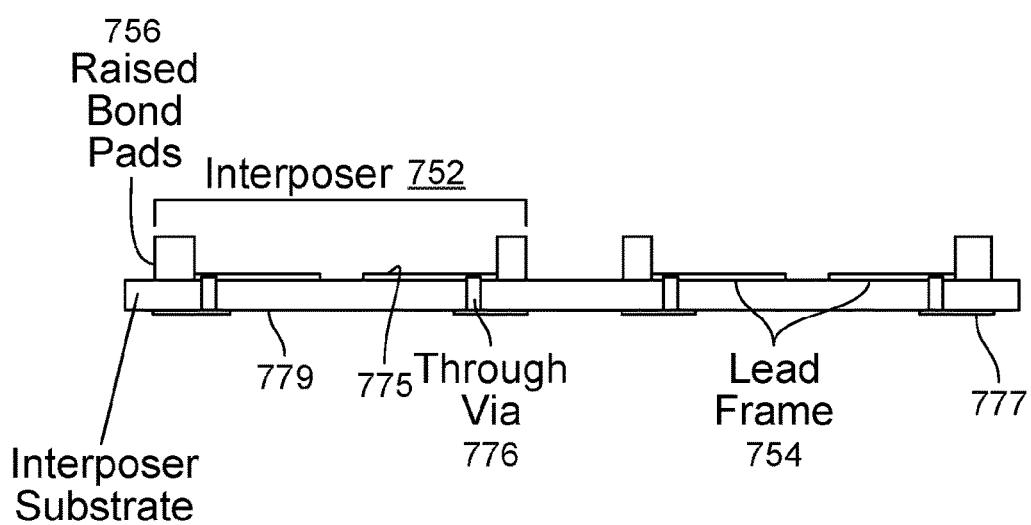
FIG. 18 is a diagram of an interposer assembly.

Referring to FIG. 18, in some examples, second conductive structures 776 can be formed through the thickness of an interposer substrate 778. The second conductive structures 776 electrically connect the pad redistribution structure 754 on a top surface 775 of the interposer with a network of conductors 777 on a bottom surface 779 of the interposer substrate 778, enabling assembly of additional components or circuits on the bottom surface 779.

Referring to FIGS. 19A-19C, three-dimensional (3-D) IC packages can be assembled by stacking multiple packages each including an electronic component, such as the packages described above. Referring specifically to FIG. 19A, two or more packages without the overlying substrate, such as the IC package 780 or 250', can be stacked to form a 3-D package 930. Referring to FIG. 19B, two or more packages including a substrate, such as the IC package 750 with interposer 752, can also be stacked to form a 3-D package 932. Referring to FIG. 19C, to assemble the 3-D packages 930, 932, the arrangement of bond pads on a device substrate 920 (e.g., a printed circuit board) and in each of the individual IC packages can be such that there is unobstructed access from each of the interposers down to the device substrate. For instance, the bond pads can be staggered such that bond pads 934 in a first IC package 936 are directly above a subset of the bond pads 938 on the device substrate 920 but not directly above bond pads 940 in a second IC package 942. Similarly, the bond pads 940 in the second IC package 942 can be positioned to be above a different subset of the bond pads 938 on the device substrate 920.

Referring to FIG. 20, in an example approach to assembling the IC package 750, an interposer substrate 850 including multiple interposers 852 is provided (880). Multiple electronic components 858, such as bumped dies, are also provided.

Each interposer 852 includes a redistribution structure 854, such as a conductive frame, and an electrode structure 856. In the example shown, the redistribution structure 854 and the raised bond pads are formed of different materials; in some examples, the redistribution structure 854 and the electrode structure 856 can be formed of the same material. The redistribution structure 854 and the electrode structure 856 can be fabricated directly on the interposer substrate 850 or can be fabricated separately and attached to the interposer substrate 850.

The interposer substrate 850 is attached to a support substrate 860 with a temporary bonding material 862 (882). Each electronic component 858 is assembled into a corresponding interposer 852 using a die assembly method. A molding process (884), such as compression molding or transfer molding, is used to encapsulate the interposers 852 with assembled electronic components 858 within a molding compound 864, resulting in a molded assembly 866 disposed on the support substrate 860. The molded assembly 866 is thinned (886) to thin the electronic component 858 and to expose the electrode structure 856 at the top surface of the molded assembly 866. For instance, the molded assembly 866 can be thinned using one or more of backgrinding, dry or wet etching or chemical mechanical polishing, or other approaches to component thinning. An interconnection structure 868, such as a solder cap, solder ball, pillar, stud, bump, pad, conductive particle, or other interconnection structure, is assembled (888) onto the exposed electrode structure 856.

The thinned molded assembly 866 is diced into molded packages (890), each package 870 including a portion of the support substrate 850 underlying a single interposer 852 with its corresponding electronic component. For instance, the molded assembly 866 can be placed on a dicing tape 872 for the dicing.

An individual molded package 870 is bonded to a device substrate 874, such as a printed circuit board (892), using any of a variety of interconnection methods. For instance, the molded package 870 can be transferred onto the device substrate 874 using a pick-and-place approach. The interconnection structures 868 connected to the electrode structure 856 of the interposer are connected to corresponding conductive features on the device substrate 874 using soldering, adhesive bonding, ultrasonic or thermosonic bonding, thermocompression bonding, diffusion bonding, or other techniques, or a combination of any two or more of them. This bonding establishes an electrical connection from a bump on the electronic component 858, through the electrode structure 856, and to the conductive feature on the device substrate 874.

The support substrate 860 is removed (894), for instance, by applying a stimulus to cause release of the temporary bonding material. The temporary bonding material is also removed, leaving the interposer 852 with connected electronic component 858 assembled on the device substrate. In some examples, the support substrate 860 is attached by a permanent adhesive material and the support substrate 860 is removed by wet or dry etching or by a mechanical means, such as polishing.

Figure 21:
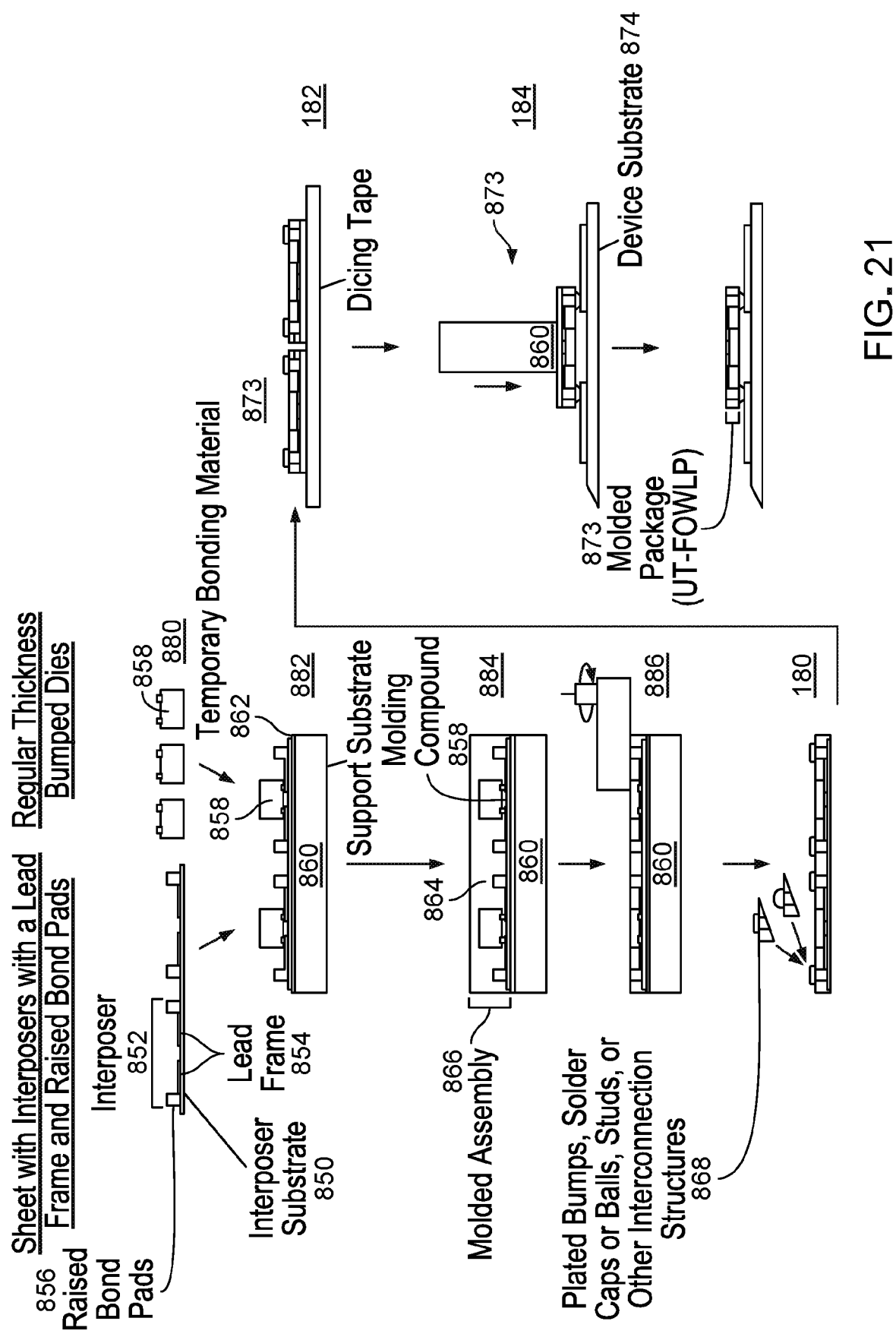

FIG. 21 shows an example approach to making an IC package without the overlying substrate, such as the IC package 780. The interposer substrate 850 is attached to the support substrate 860 and the electronic components 858 are assembled into the corresponding interposers as described above (880, 882). A molding process (884) is used to encapsulate the interposers 852 with assembled electronic components 858 within the molding compound 864 to form the molded assembly 866.

The molded assembly 866 is thinned (886) and the support substrate 860 is released from the thinned molded assembly 866 (180), for instance, by applying a stimulus to cause release of the temporary bonding material. In some examples, the support substrate 860 is not attached by a temporary bonding material and the support substrate 860 is removed by wet or dry etching or by a mechanical means. Interconnection structures 868 are assembled onto the exposed bond pads 856. The support substrate 860 can be released or removed before or after thinning of the molded layer. The support substrate 860 can be released or removed before or after the interconnection structures 868 are assembled. The thinned molded assembly is diced into molded packages 873 (182) and the molded packages are transferred individually to the device substrate 874 (184).

Figure 22:
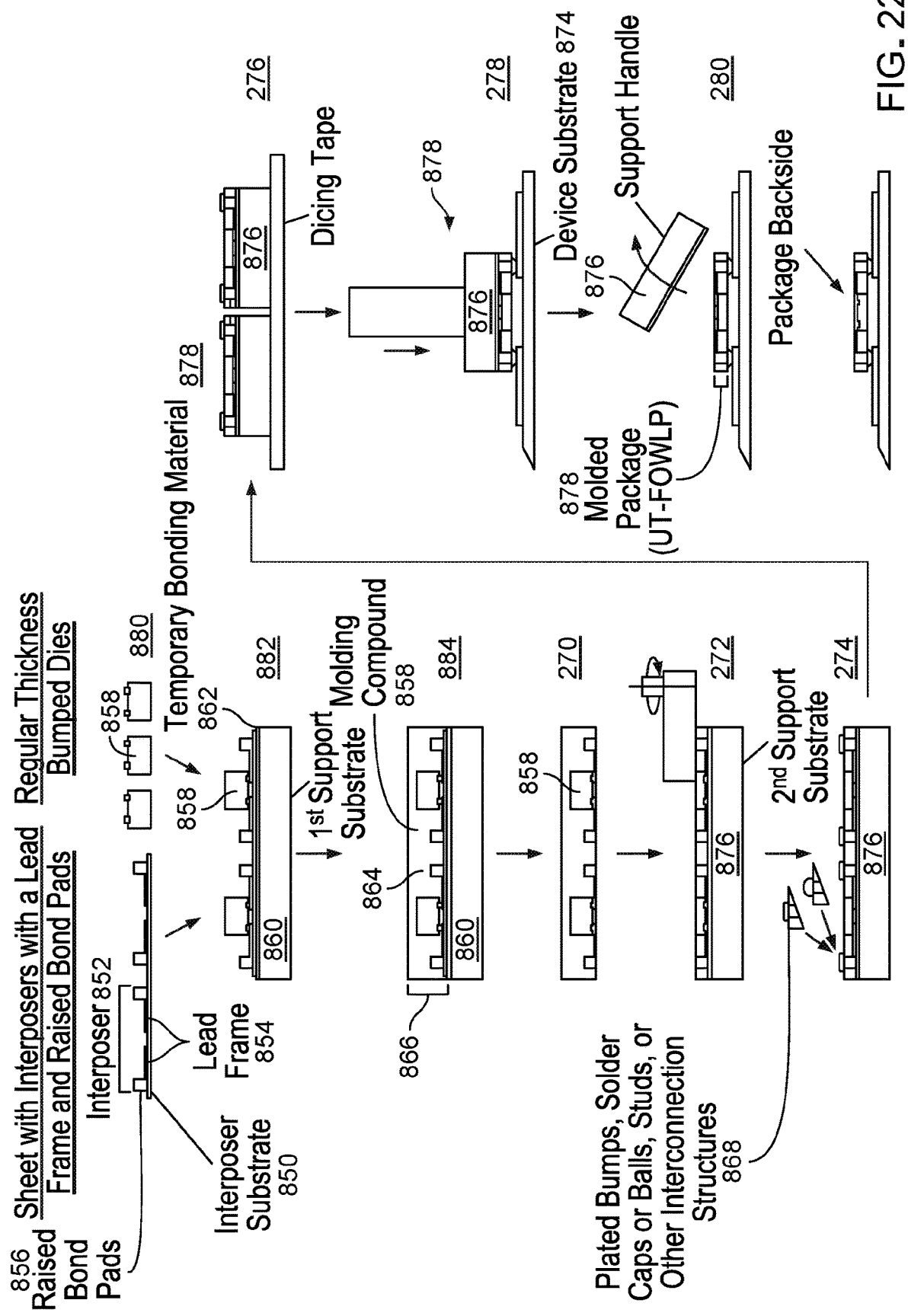

Referring to FIG. 22, in an example approach to making an IC package without the overlying substrate, such as the IC package 780, the interposer substrate 850 is attached to the support substrate 860 and the electronic components 858 are assembled into the corresponding interposers as described above (880, 882). A molding process (884) is used to encapsulate the interposers 852 with assembled electronic components 858 within the molding compound 864 to form the molded assembly 866. The support substrate 860 is released or removed from the molded assembly 866 (270) and the interposer substrate 850 is removed, e.g., by dry or wet etching or by mechanical polishing or abrasion, leaving the redistribution structure 854 exposed at the bottom surface of the molded layer.

The molded layer is attached to a second support substrate 876 via a second temporary bonding material and the molded layer is thinned (272) to expose the bond pads 856 at the top surface. Interconnection structures 868 are assembled (274) onto the exposed bond pads 856.

In some examples, the second support substrate 876 can be attached after thinning of the molded layer. In some examples, the second support substrate 876 can be attached after the interconnection structures 868 are assembled.

The thinned molded layer on the second support substrate 876 is diced into molded packages 878 (276) and the molded packages 878 are transferred individually to and assembled on the device substrate 874 (278). The second support substrate 876 is removed (280) by applying a stimulus to the second temporary bonding material, causing the redistribution structure 854 to be exposed on the top surface of the IC package, thus allowing for the assembly of other electronic components. In some examples, the second support substrate 876 is not attached by a temporary bonding material and is removed by wet or dry etching or by a mechanical means.

Figure 23:
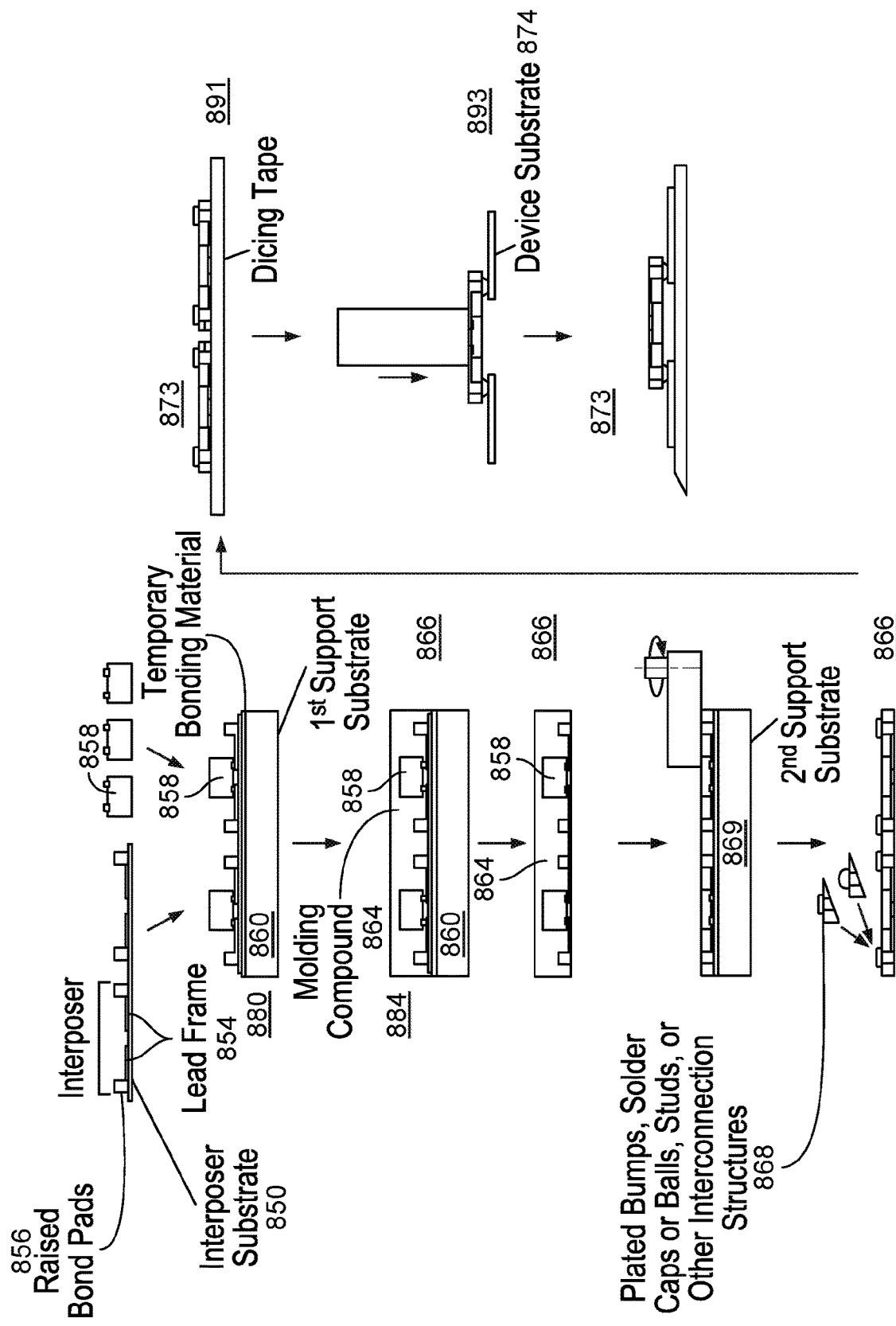

Referring to FIG. 23, in an example approach to making an IC package without the overlying substrate, such as the IC package 780, the interposer substrate 850 is attached to the support substrate 860 and the electronic components 858 are assembled into the corresponding interposers (880). A molding process (884) is used to encapsulate the interposers 852 with assembled electronic components 858 within the molding compound 864 to form the molded assembly 866. The support substrate 860 is released from the molded assembly 866 (886) and the interposer substrate 850 is removed. The molded assembly 866 is attached to a second support substrate 869 via a second temporary bonding material and the molded layer is thinned (888) to expose the bond pads 856 at the top surface. The second support substrate 869 is removed (889), leaving the redistribution structure 854 exposed at the bottom surface of the molded assembly 866. Interconnection structures 868 are assembled onto the exposed bond pads 856. The thinned molded assembly is diced (891) into molded packages 873 and the molded packages are transferred (893) individually to the device substrate 874.

Figure 24:
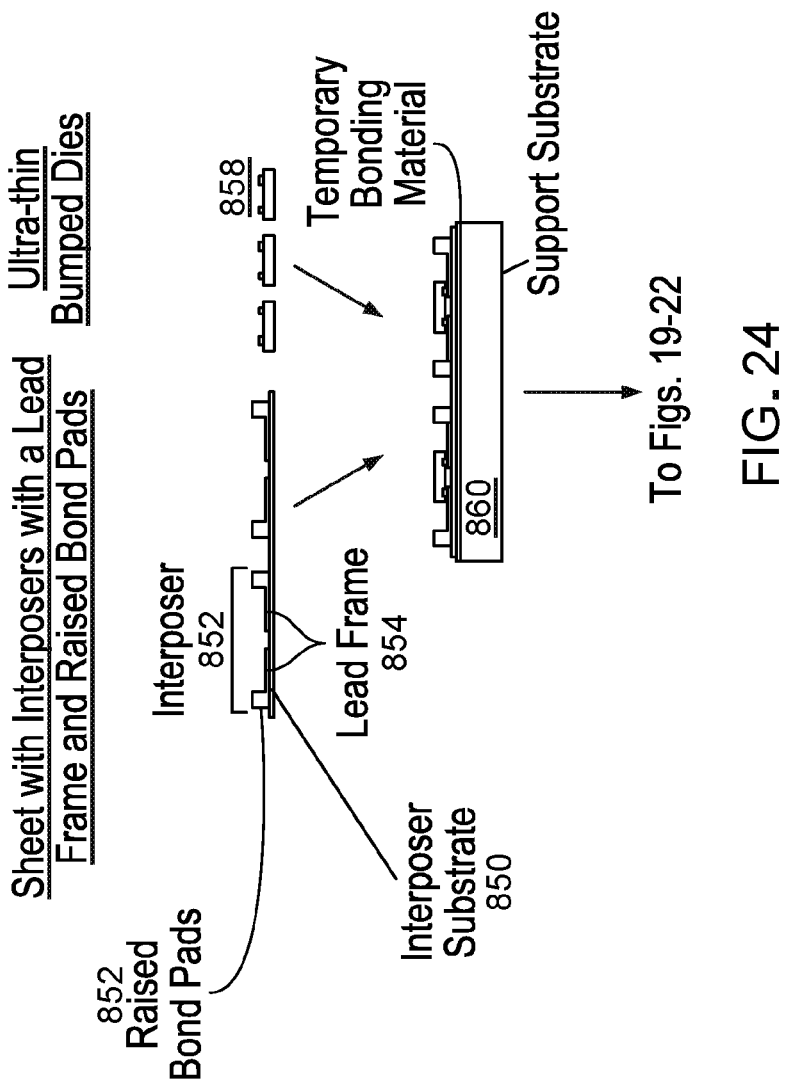

Referring to FIG. 24, in an example approach to making an IC package using ultra-thin bumped electronic components, the interposer substrate 850 is attached to the support substrate 860 and the ultra-thin electronic components are assembled into the corresponding interposers using a die assembly method, such as contact assembly methods (e.g., pick-and-place methods) or non-contact assembly methods (e.g., tmSLADT). The assembly can be transferred onto a device substrate and interconnected to the device substrate using the processes shown in any of FIGS. 20-23.

Figure 25:
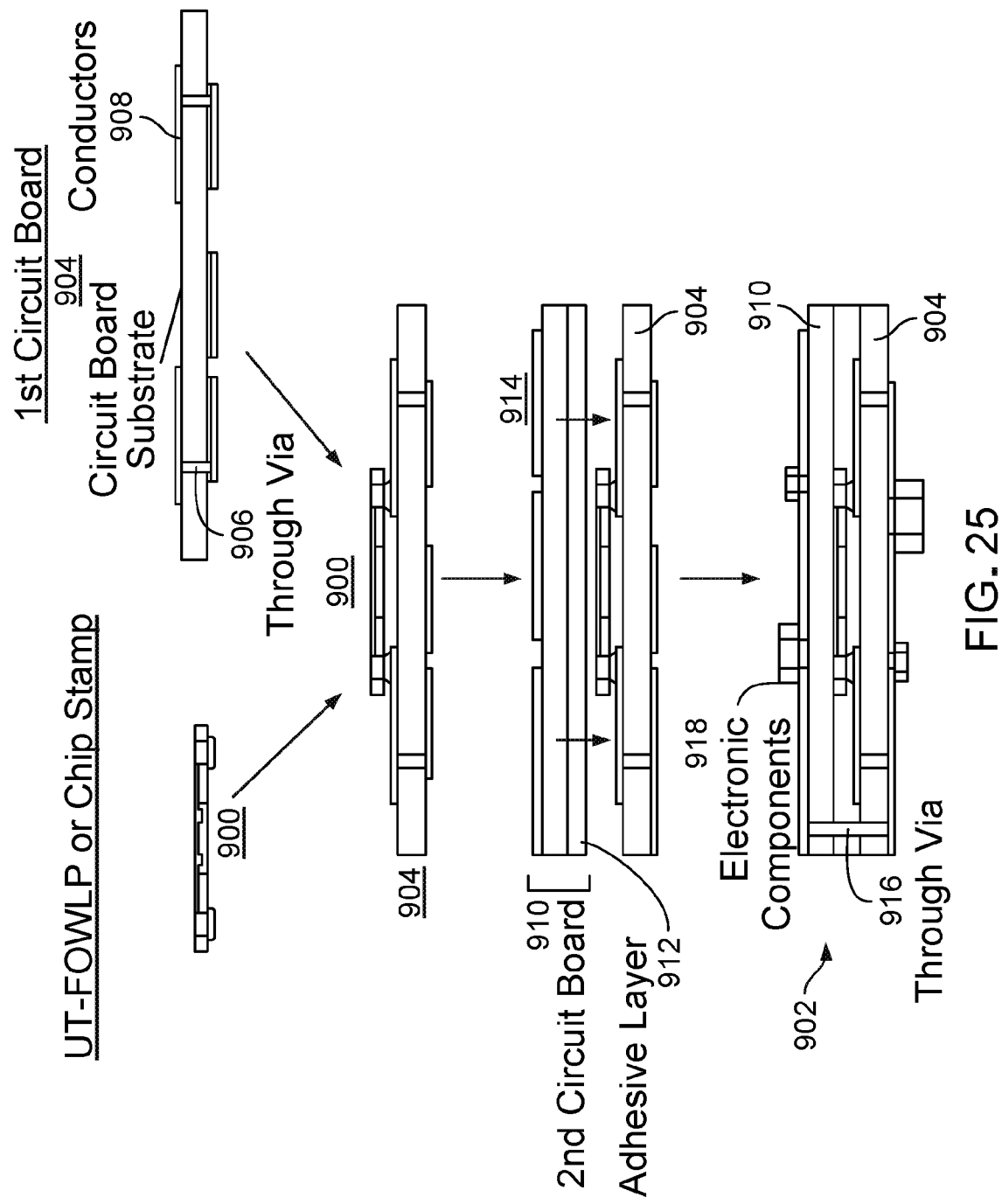
FIGS. 25 and 26 are diagrams of assembly of an integrated circuit package.

Referring to FIG. 25, an IC package 900 including an ultra-thin electronic component can be embedded into a multilayer device substrate 902. The IC package 900 can be assembled according to any of the approaches described above. A first circuit board 904 includes vias 906 through the circuit board 904 and conductors 908 formed on the top and bottom surfaces of the circuit board 904.

The IC package 900 is assembled onto the first circuit board 904 such that electrical connection features of the ultra-thin electronic component are electrically connected to the conductors 908 of the first circuit board 904, e.g., by way of conductive features in the IC package 900.

A second circuit board 910 with an adhesive layer 912 formed thereon is attached to the first circuit board, e.g., by lamination. The adhesive layer can be a liquid, semisolid, or solid material attached or dispensed onto the second circuit board 910 prior to assembly or added separately as a standalone film during assembly. The adhesive layer 912 encompasses the package 900, filling the space between the first and second circuit boards 904, 910. The adhesive layer 912 is sufficiently thick to accommodate the IC package 900.

In some examples, the second circuit board 910 can include conductors 914 formed on a top surface of the second circuit board 910. To enable the conductors 914 to be electrically connected to the first circuit board 904, vias 916 can be formed through the second circuit board 910 and the first circuit board 904. Additional electronic components 918 can be assembled onto the second circuit board 910 and electrically connected to the first circuit board 904 by way of the conductors 914 and vias 916. Additional circuit boards can be added to the multilayer device substrate 902, and additional IC packages can be assembled on one or more of the circuit boards of the 3-D device substrate 902, using a similar approach.

The multilayer device substrate 902 does not require a cavity to be formed in the circuit boards (e.g., the second circuit board 910) to accommodate the thickness of the electronic components. As a result, the multilayer device substrate 902 has a thinner profile and can have a lower production cost than other multilayer substrates with embedded IC packages.

Figure 26:
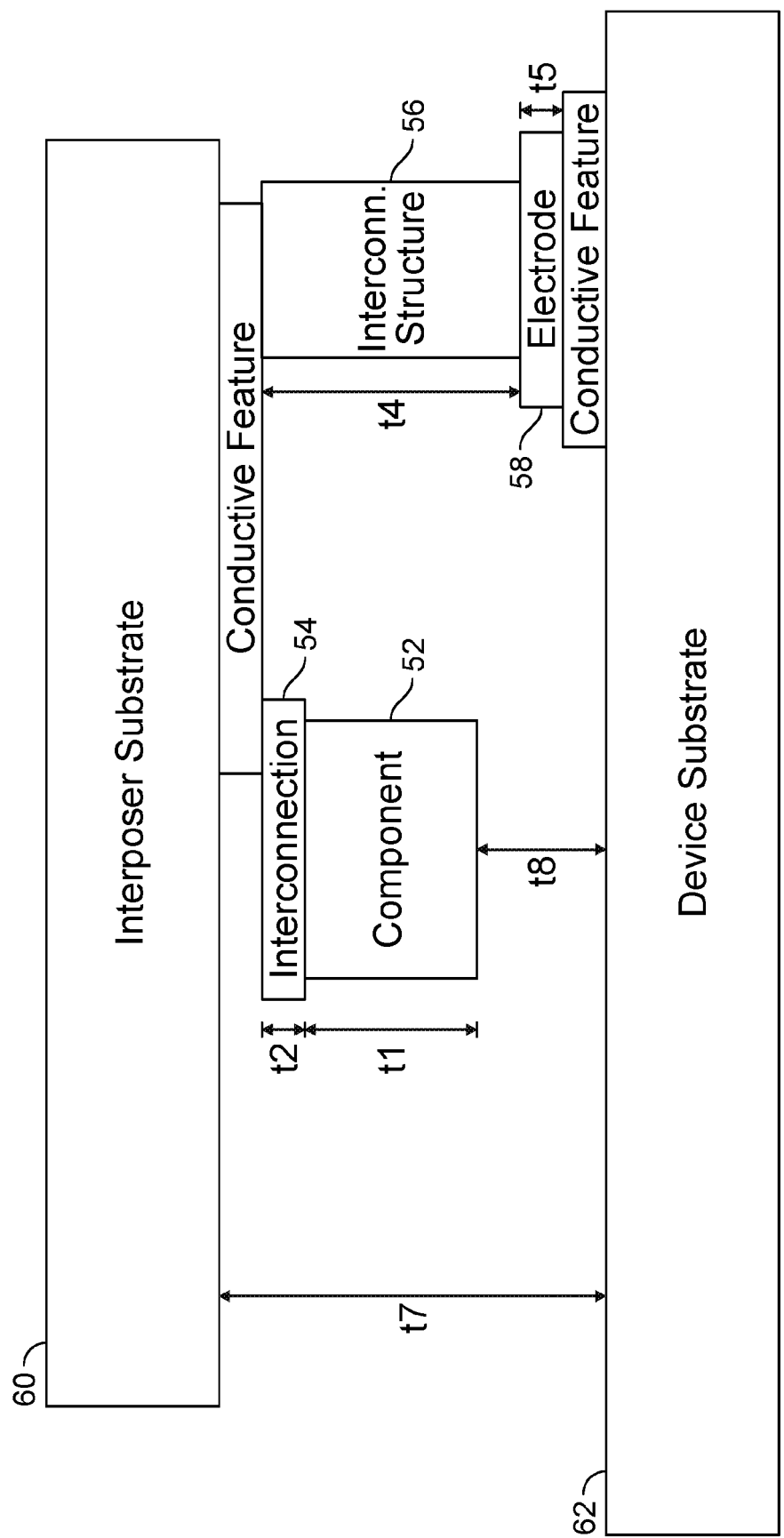

In some examples, the IC packages described here can be very thin. For instance, referring to FIG. 26, a representative IC package 50 is shown. The IC package 50 can be any of the IC packages described here, such as the IC packages 250, 750. In the representative IC package 50, the thickness of an electronic component 52 and an interconnection system 54 together ($t_1+t_2$) can be less than the thickness of an interconnection structure 56 and an electrode 58 ($t_4+t_5$). In some examples, the thicknesses $t_1+t_2$ and $t_4+t_5$ can both be about 500 μm or less, such as about 200 μm or less, about 100 μm or less, or about 50 μm or less. For instance, the interconnection system 54 can be, e.g., the interconnection system 258 of the IC package 250 or the interconnection system 766 of the IC package 750. The interconnection structure 56 can be, e.g., the second conductive element 770 of the IC package 750 and the electrode 58 can be, e.g., the interconnection structure 772 of the IC package 750. The interconnection structure 56 and electrode 58 together can correspond to the electrode structure 264 of the IC package 250.

The thickness of the electronic component 52 and the interconnection system 54 ($t_1+t_2$) can be less than the thickness $t_4$ of the interconnection structure 56. The thicknesses $t_1+t_2$ and $t_4$ can both be about 200 μm or less, such as about 100 μm or less, or about 50 μm or less.

The separation $t_7$ between an interposer substrate 60 and a device substrate 62 in the IC package 50 can be about 500 μm or less, such as about 200 μm or less, about 100 μm or less, or about 50 μm or less. In some cases, the bottom surface of the electronic component 52 can be in close proximity to the device substrate 62. For instance, the separation $t_8$ between a bottom surface of the electronic component 52 and the device substrate 62 can be about 100 μm or less, such as about 50 μm or less, about 25 μm or less, or about 10 μm or less. In some examples, the bottom surface of the electronic component 52 can be in physical contact with the device substrate 62 (e.g., $t_8$ can be zero).

The thickness of the IC package 50 can be about 500 μm or less, such as about 200 μm or less, about 100 μm or less, or about 50 μm or less.

Other implementations are also within the scope of the following claims.

What is claimed is:

1. An apparatus comprising:
a first substrate including one or more first electrical connection features; and
an assembly including:
a second substrate, the second substrate being a flexible inverted interposer;
conductive features of the second substrate, the conductive features in contact with the second substrate, wherein one or more of the conductive features are electrically connected to corresponding first electrical connection features of the first substrate; and
an electronic component between the second substrate and the first substrate and electrically connected to one or more of the conductive features of the second substrate via one or more second electrical connection features exposed on a first surface of the electronic component, in which the first surface of the electronic component faces the second substrate, the electronic component having a thickness of less than 50 µm,
in which the conductive features continuously extend on a first surface of the second substrate between (i) locations at which the conductive features electrically connect to the second electrical connection features exposed on the first surface of the electronic component and (ii) locations at which the conductive features electrically connect to the first electrical connection features of the first substrate, wherein the electronic component is a flexible electronic component, and
in which a separation between the first substrate and the second substrate is 500 µm or less.

2. The apparatus of claim 1, in which the assembly includes multiple electronic components between the second substrate and the first substrate.

3. The apparatus of claim 1, in which the electronic component is formed on the second substrate or embedded into a body of the second substrate.

4. The apparatus of claim 1, comprising a second electronic component embedded within a body of the second substrate.

5. The apparatus of claim 1, in which the electronic component is positioned at the first surface of the second substrate, and in which the assembly comprises a second electronic component positioned at a second surface of the second substrate, the second surface opposite the first surface.

6. The apparatus of claim 1, in which the conductive features are formed on the first surface of the second substrate, the first surface of the second substrate facing the first substrate.

7. The apparatus of claim 6, in which a gap between the first surface of the second substrate and a surface of the second substrate is filled with an encapsulant.

8. The apparatus of claim 1, in which at least portions of the conductive features are embedded within a body of the second substrate.

9. The apparatus of claim 1, in which the one or more second electrical connection features comprise one or more bond pads each including a corresponding bump, in which at least one of the bond pads is electrically connected to a corresponding one of the conductive features of the second substrate through the corresponding bump.

10. The apparatus of claim 9, in which a pitch of the one or more bond pads of the electronic component is different than a pitch of the first electrical connection features of the first substrate.

11. The apparatus of claim 1, in which the conductive features comprise redistribution features disposed on the first surface of the second substrate and are oriented substantially parallel to the first surface of the second substrate, and in which the first surface of the second substrate faces the electronic component and the first substrate, the redistribution features being conductive lines.

12. The apparatus of claim 1, in which each conductive feature includes a first conductive structure oriented in parallel to the first surface of the second substrate and a second conductive structure oriented perpendicular to the first surface of the second substrate.

13. The apparatus of claim 12, in which the assembly includes an encapsulant layer between the second substrate and the first substrate, and in which the second conductive structures are formed through a thickness of the encapsulant layer.

14. The apparatus of claim 12, in which the first conductive structures comprise a redistribution feature, the redistribution feature being a conductive line.

15. The apparatus of claim 1, in which at least one of the conductive features of the second substrate includes a contact pad connected to a corresponding conductive line, in which the contact pads is positioned around an edge of the electronic component.

16. The apparatus of claim 15, in which one or more of the contact pads of the second substrate are each connected to a corresponding one of one or more electrodes, and in which the one or more electrodes are each electrically connected to a corresponding one of the first electrical connection features of the first substrate.

17. The apparatus of claim 16, in which the electronic component has a thickness no greater than the combination of a thickness of the electrodes and a thickness of the first electrical connection features of the first substrate.

18. The apparatus of claim 1, in which the separation between the first substrate and the second substrate is 100 µm or less.

19. The apparatus of claim 1, in which the first substrate is 10 µm or less from a second surface of the electronic component facing the first substrate.

20. The apparatus of claim 19, in which the first substrate is in physical contact with the second surface of the electronic component facing the first substrate.

21. The apparatus of claim 1, in which the first substrate comprises a flexible substrate.

22. The apparatus of claim 21, in which the first substrate comprises a printed flexible circuit board.

23. The apparatus of claim 21 wherein the electronic component includes bond pads that are each electrically connected to a corresponding conductive line on the first surface of the second substrate using an interconnection system, the interconnection system being made using adhesive bonding including at least one of an anisotropic conductive adhesive, an isotropic conductive adhesive, and a conductive adhesive.

24. The apparatus of claim 23, in which the second substrate comprises an elastomeric material.

25. The apparatus of claim 21, comprising a conductive adhesive disposed between the flexible substrate and the assembly, in which the conductive adhesive forms a seal around the electronic component.

26. The apparatus of claim 25, in which the conductive adhesive comprises an anisotropic conductive adhesive that provides an electrical connection between the conductive features of the second substrate and the corresponding first electrical connection features of the first substrate.

27. The apparatus of claim 1, in which the assembly includes second conductive features formed through a thickness of the second substrate, each second conductive feature electrically connected to one of the conductive features, and
in which the apparatus includes a second electronic component electrically connected to one or more of the second conductive features, the assembly arranged such that the second substrate is disposed between the electronic component and the second electronic component.

28. The apparatus of claim 27, comprising a second assembly disposed on the second substrate, the second assembly comprising:
a third substrate;
third conductive features in contact with the third substrate, one or more of which are electrically connected to corresponding second conductive features of the second substrate; and
the second electronic component between the third substrate and the second substrate and electrically connected to one or more of the third conductive features.

29. The apparatus of claim 1, comprising:
a third substrate disposed on the assembly such that the assembly is between the first substrate and the third substrate, the third substrate comprising one or more third electrical connection features electrically connected to one or more of the first electrical connection features of the first substrate, in which the third electrical connection features are formed through a thickness of the third substrate and in which one or more of the first electrical connection features of the first substrate are formed through a thickness of the first substrate; and
an adhesive layer between the first substrate and the third substrate, wherein the assembly is at least partially encapsulated in the adhesive layer.

30. The apparatus of claim 29, in which a first surface of the first substrate faces the third substrate, and comprising a second electronic component disposed on a second surface of the first substrate, the second electronic component electrically connected to one or more of the third electrical connection features.

31. An assembly comprising:
an electronic component having a first surface at which a pattern of first electrical connection features are exposed, the electronic component being a flexible electronic component, the electronic component having a thickness of less than 50 µm,
a substrate having a substrate surface at which a pattern of second electrical connection features are exposed, and
flexible inverted interposer comprising conductors that connect at least some of the first electrical connection features of the electronic component with at least some of the second electrical connection features of the substrate, with the electronic component in a space between the flexible inverted interposer and the substrate and with the first surface of the electronic component not facing the substrate surface,
in which the conductors include conductive features continuously extending on the surface of the flexible inverted interposer between (i) locations at which the conductive features electrically connect to the first electrical connection features exposed on the first surface of the electronic component and (ii) locations at which the conductive features electrically connect to the second electrical connection features of the substrate, and in which a second surface of the electronic component is 100 µm or less from the substrate surface of the substrate.

32. The apparatus of claim 1, wherein an electrical connection between the electronic component and the first substrate is achieved without the use of through vias in a body of the second substrate.

33. The assembly of claim 31, wherein an electrical connection between the electronic component and the substrate is achieved without the use of through vias in a body of the flexible inverted interposer.

34. The assembly of claim 31 wherein the electronic component includes bond pads that are each electrically connected to a corresponding conductive line on the surface of the flexible inverted interposer using an interconnection system, the interconnection system being made using adhesive bonding including at least one of an anisotropic conductive adhesive, an isotropic conductive adhesive, and a conductive adhesive.

* * * * *